United States Patent [19]

Chih et al.

[11] Patent Number: 4,584,653

[45] Date of Patent: Apr. 22, 1986

[54] METHOD FOR MANUFACTURING A GATE ARRAY INTEGRATED CIRCUIT DEVICE

[75] Inventors: Samuel Chih, Mountain View, Calif.; Osam Ohba, Inagi, Japan

[73] Assignees: Fujitsu Limited, Kawasaki, Japan; Fujitsu Microelectronics Inc., Santa Clara, Calif.

[21] Appl. No.: 477,751

[22] Filed: Mar. 22, 1983

[51] Int. Cl.$^4$ .............................................. G06F 15/46

[52] U.S. Cl. .................................. 364/491; 364/488; 357/40

[58] Field of Search ............... 364/488, 489, 490, 491; 29/576 R, 577 R, 577 C; 357/40, 45, 51, 68

[56] References Cited

U.S. PATENT DOCUMENTS

| | | | |
|---|---|---|---|
| 4,084,105 | 4/1978 | Teranishi et al. | 307/450 |
| 4,255,672 | 3/1981 | Ohno et al. | 357/40 |
| 4,377,849 | 3/1983 | Finger et al. | 364/300 |
| 4,484,292 | 11/1984 | Hong et al. | 364/491 |

OTHER PUBLICATIONS

Solid Logic Design Automation; Case et al., IBM Journal, Apr. 1964, pp. 127–140.

Producing Integrated Circuits from a Circuit Logic Input; O. Bilous et al., IBM Technical Disclosure Bulletin, vol. 13, No. 5, Oct. 1970, pp. 1084–1089.

Electronics International, "Gate-Array Development System Speeds Designs to Market", J. S. Koford et al., vol. 54, No. 24, Nov. 30, 1981, pp. 116–120.

Wescon Technical Paper, "The LSI Development System i (LDS I)—A Year of Maturity", Lobo et al., vol. 26, Sep. 1982, pp. 1–6.

Electronics International, "Applying CAD to Gate Arrays Speeds 32-Bit Minicomputer Design", R. A. Armstrong, vol. 54, No. 1, Jan. 13, 1981, pp. 167–173.

Electronics International, "Graphics Editor Constructs Standard Cells, Symbolizes Subsystems", Dickens et al., vol. 54, No. 24, Nov. 30, 1981, 121–125.

Electro/80 Conference Record, "Using MECL 10K Macrocell Array as a Basic Building Block for Standard Product Development, vol. 5, 13–15, May 1980.

Electronics International, "Work Station Saves System Design Time", vol. 56, No. 1, Jan. 13, 1983, pp. 173–177.

Wescon Technical Paper, "A New Generation of Silicon Gate CMOS Arrays", by J. Martin, vol. 26, Sep. 1982, pp. 1–10.

Electronics International, "Design Automation Speeds Through Customization of Logic Arrays", Horton et al., vol. 54, No. 14, Jul. 14, 1981, pp. 132–137.

Proceedings of the IEEE, "CAD Systems for VLSI in Japan", by T. Sudo et al., vol. 71, No. 1, Jan. 1983, pp. 129–143.

Fujitsu-Scientific and Technical Journal, "A CAD System for Logic Design Based on Frames and Demons", Saito et al., vol. 18, No. 3, Sep. 1982, pp. 437–451.

Electrical Design News, "Automated Design and Simulation Aids Speed Semicustom-IC Development", vol. 27, No. 15, Aug. 4, 1982, pp. 35–48.

*Primary Examiner*—Gary Chin
*Assistant Examiner*—Heather R. Herndon
*Attorney, Agent, or Firm*—Staas & Halsey

[57] ABSTRACT

A method for manufacturing a gate array IC device in which the turn-around time on design is short, the system design is simple, and the memory area for designing is reduced. The method includes manufacturing a master bulk pattern of a basic cell array on the semiconductor substrate, and storing, in semi-permanent memory, symbol data and detailed data for standard macro cells and standard expanded macro cells prior to designing a logic system. Each macro cell comprises one or more basic cells and has a basic logic function. Each expanded macro cell comprises plural macro cells and has a more complicated and sophisticated logic function than the macro cells. In addition, the logic functions of the expanded macro cells are standard in the logic system design technology area. When a designer creates a logic system, only symbol data for the macro cells and the expanded macro cells, and the connections thereof are used and stored in the memory, so that it is relatively easy to design the system. Actual conductive wiring patterns are synthesized from the logic system data and the detailed data; consequently these patterns are produced on the semiconductor substrate which is already provided with a master bulk pattern so as to connect the basic cells in accordance with the design.

29 Claims, 28 Drawing Figures

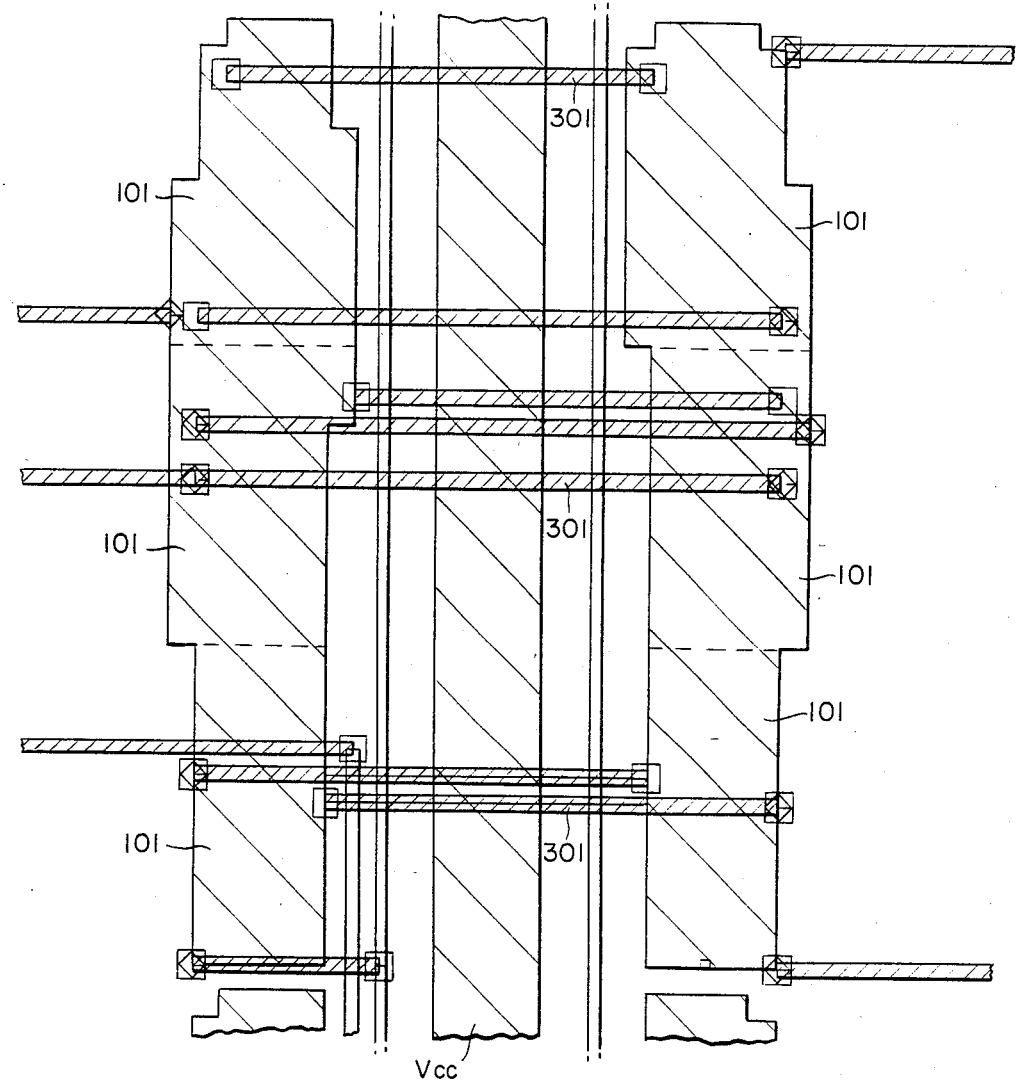

4,584,653

METHOD FOR MANUFACTURING A GATE ARRAY INTEGRATED CIRCUIT DEVICE

BACKGROUND OF THE INVENTION

This invention relates to a method for manufacturing a gate array integrated circuit device which comprises a logic system provided on a semiconductor substrate, and moreover relates to a new concept for an expanded macro cell which comprises plural macro cells.

In gate array technology, a manufacturer prepares a master bulk pattern which includes basic cells in array form on a semiconductor substrate, prior to the submission of detailed design data for a particular logic system. After finishing the design of the logic system, the customer, i.e. system designer, supplies detailed design data, describing the particular logic system, to the manufacturer. Thereafter, the manufacturer produces a wiring pattern according to this logic system information and provides the wiring pattern on the semiconductor substrate which connects the basic cells. Unlike the fully customized integrated circuit device technology, in which the manufacturer must develop not only a wiring pattern but also a custom bulk pattern on a semiconductor substrate, the "semi-custom" gate array technology has advantages in that the turn-around time on a design is very short, because the manufacturer only has to produce a wiring pattern. Moreover, although the manufacturing cost is lower than that of a full-custom integrated circuit device, the system designer still receives the originally designed integrated circuit device.

Recently, the complexity and density of gate array integrated circuit devices has become greater, in part due to the fact that the logic systems designed by customers have become more complex. In conventional gate array design technology, when a system designer creates a new original logic system, he usually makes up a logic diagram for the logic system by using symbols for macro cells, each of which comprises a basic cell or a group of several basic cells. Therefore, if the logic system is very complex, even if the logic diagram of the logic system is drawn in symbols representing the macro cells, this type of logic diagram is still complex for designers. This makes it very difficult to understand the system logic from the logic diagram; and also makes it very difficult for logic system designers to design an accurate logic diagram based on their original idea, thereby resulting in a significant number of errors and increasing the design cycle time.

SUMMARY OF THE INVENTION

It is an object of this invention to provide a method for manufacturing a gate array integrated circuit device, which simplifies the steps for designing logic systems.

It is another object of this invention to provide a method for manufacturing a gate array integrated circuit device which simplifies the logic system design.

It is a further object of this invention to provide a method for manufacturing a gate array integrated circuit device which reduces the turn-around time for designing the logic system by reducing the amount of data, which is required from the designer (i.e. customer), to describe the system, thereby reducing the cost of data storage, and ultimately the manufacturing cost.

According to the present invention, in addition to a conventional macro cell which comprises one or more basic cells and has a simple logic function, a new macro cell (hereinafter an expanded macro cell) which comprises a plurality of macro cells and has a logic function which is more complex than that of the macro cells, is introduced for the design of a logic system. Symbol data for identifying the type of expanded macro cell and detailed data for identifying the included macro cells, the connection of the macro cells and the logic function thereof, are used to define the expanded macro cell. Significantly, the logic function for each expanded macro cell is that of a standard logic circuit known to designers in the logic system design art. The symbol data and the detailed data for the expanded macro cells are stored in a semi-permanent memory, as are symbol data and detailed data for the macro cells. When a customer designs a logic system, he develops logic system data for the designed logic system, and this logic system data comprises only symbol data for the expanded macro cells, the macro cells, and their interconnections. The logic system data does not include the more complex detailed data. A conductive wiring pattern is then provided for the semiconductor substrate by synthesizing the logic system data (provided by the customer) and the detailed data (stored in semi-permanent memory). Thus, using the method of the present invention, it is very easy for a customer or systems designer to design, and also for a manufacturer to manufacture, a gate array integrated circuit device for a logic system.

Other features and objects of the present invention will be made clear from the following description regarding the preferred embodiments, with reference to the accompanying drawings, wherein like numerals refer to like parts throughout.

BRIEF DESCRIPTION OF THE DRAWINGS

FIG. 7 is a plan view of the macro cell of FIG. 5;

FIG. 10 is an illustration of a symbol representing the expanded macro cell of FIG. 9;

DESCRIPTION OF THE PREFERRED EMBODIMENTS

Figure 1:
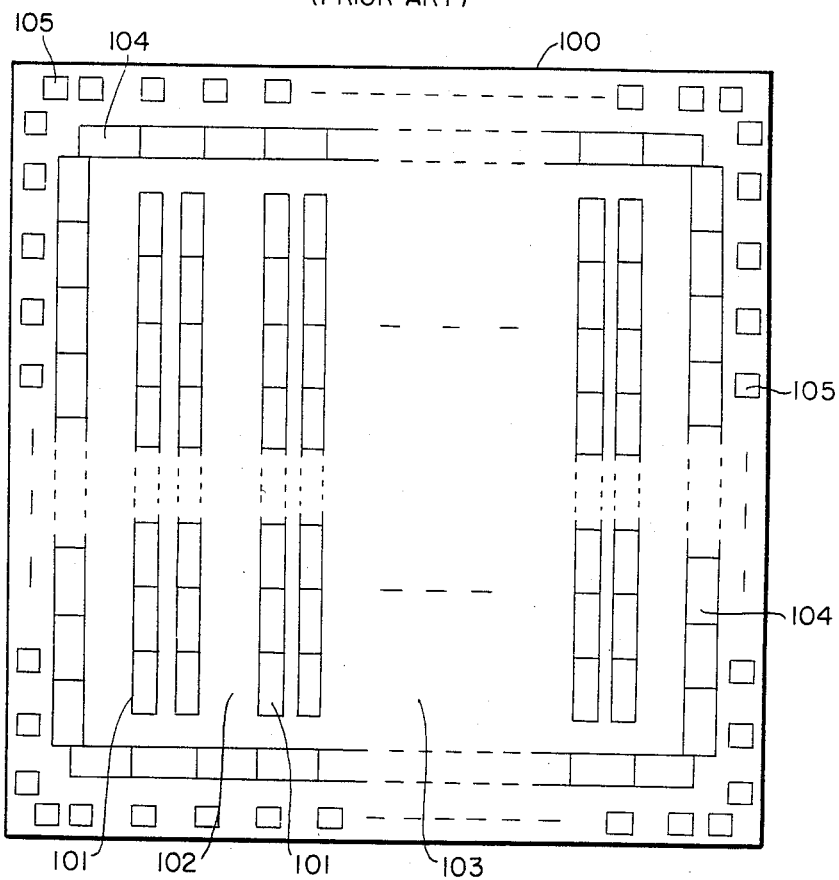
FIG. 1 is a plan view of a semiconductor substrate having basic cells formed in an array.

FIG. 1 is a plan view of a semiconductor substrate or chip 100 which is prepared by using a master bulk pattern. A large number of basic cells 101 are arranged on the substrate 100 in a basic cell array area 103, and input/output buffers 104 are located about the periphery of the basic cell array area 103. There are also a number of pads 105 located on the substrate periphery for input/output signals. In the basic cell array area 103, there is a channel region 102 between rows of basic cells 101 where a conductive wiring pattern for interconnection of the electric elements in the basic cells 101 is arranged.

Figure 2:
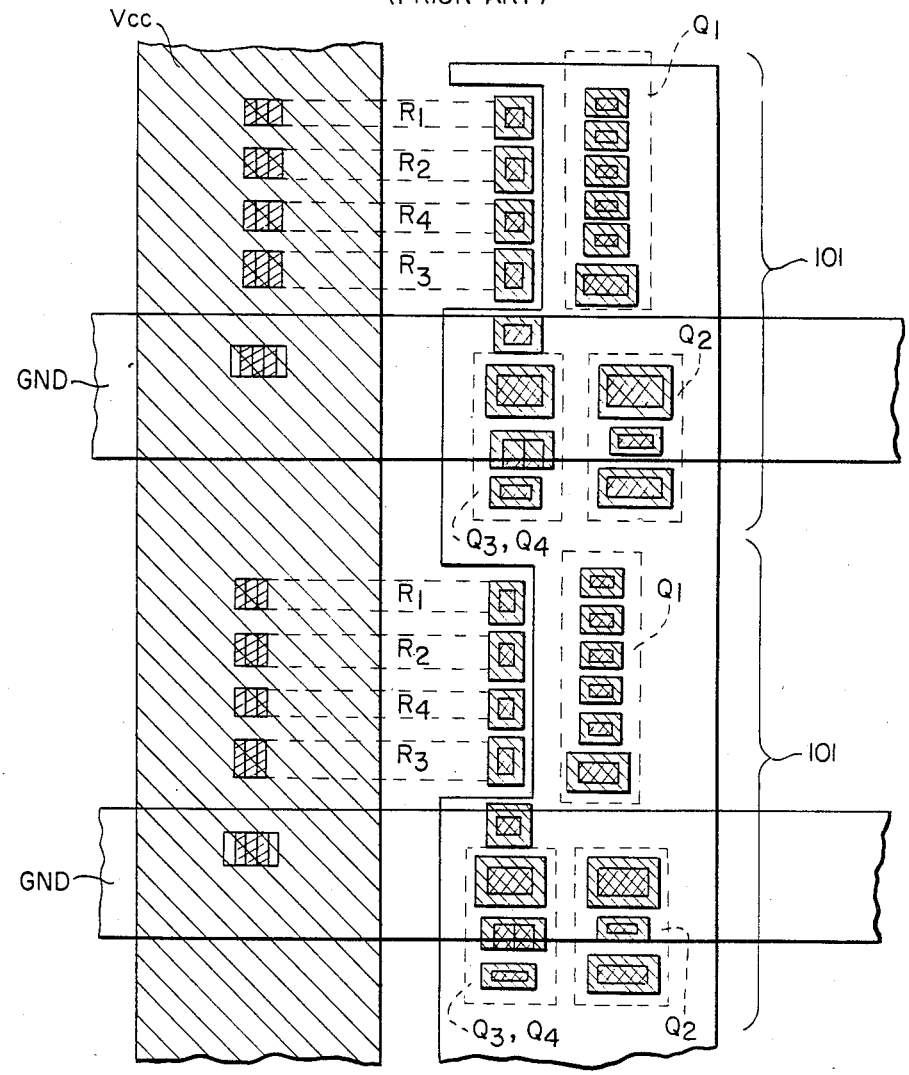
FIG. 2 is a plan view of a bulk pattern for a basic cell.

FIG. 2 is a plan view of a master bulk pattern for two basic cells 101. In each basic cell 101, diffused regions are produced in the surface of the semiconductor substrate for an input transistor $Q_1$, an output transistor $Q_2$, a Schottky diode $Q_3$, a diode $Q_4$, and resistors $R_1$, $R_2$, $R_3$. At least $Q_1$, $Q_2$, $Q_3$ and $Q_4$ are active electrical elements. Vcc and GND are power supply lines.

According to the method of the present invention, the first step is the manufacture of the basic cells 101 in the form of an array on the semiconductor substrate.

Figure 3:
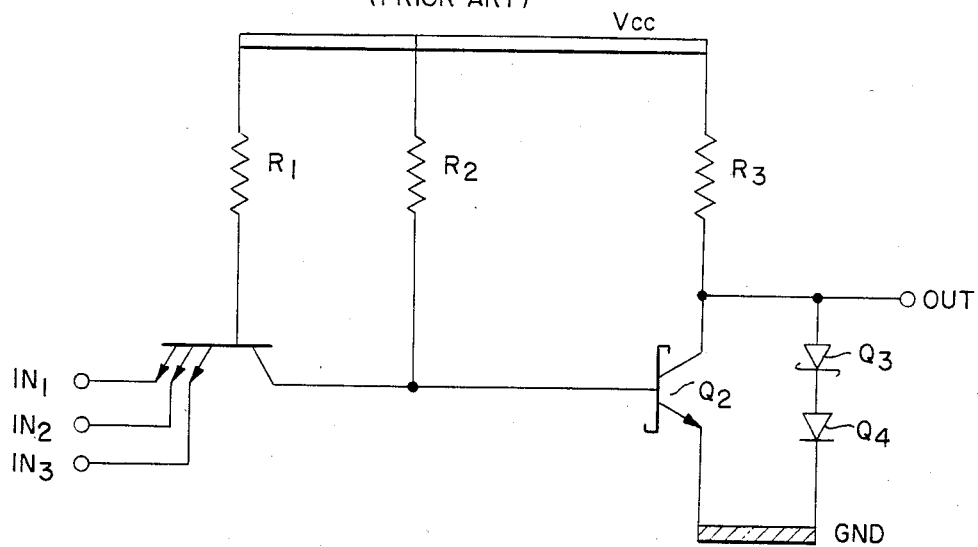
FIG. 3 is a circuit diagram of a basic cell in which electric elements of the basic cell are interconnected.

FIG. 3 is a circuit diagram of a basic cell 101, wherein the electric circuit elements are interconnected therein; wherein $Q_1$, $Q_2$, $Q_3$, $Q_4$ are the same as in FIG. 2; wherein Vcc and GND are power supplies; and wherein $IN_1$, $IN_2$, $IN_3$ are inputs and OUT is an output. When the electric circuit elements, e.g., transistors and resistors, in a basic cell 101 are interconnected therein, the basic cell 101 forms a basic gate as a result of the interconnection of the elements within the basic cell. This basic gate can exhibit a logic function, e.g. a NAND function. Therefore, this basic gate forms a macro cell which comprises only one basic cell. Thus, this macro cell has a minimum size and has a logic function, e.g. a 3-input NAND gate.

Figure 4:
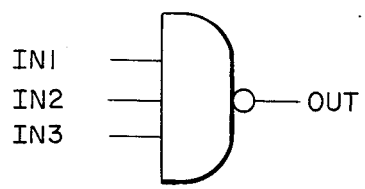
FIG. 4 is a logic diagram of an example of a macro cell, i.e., a 3-input NAND gate.

FIG. 4 is a logic diagram of the macro cell of FIG. 3, that is, a 3-input NAND gate.

Figure 5:
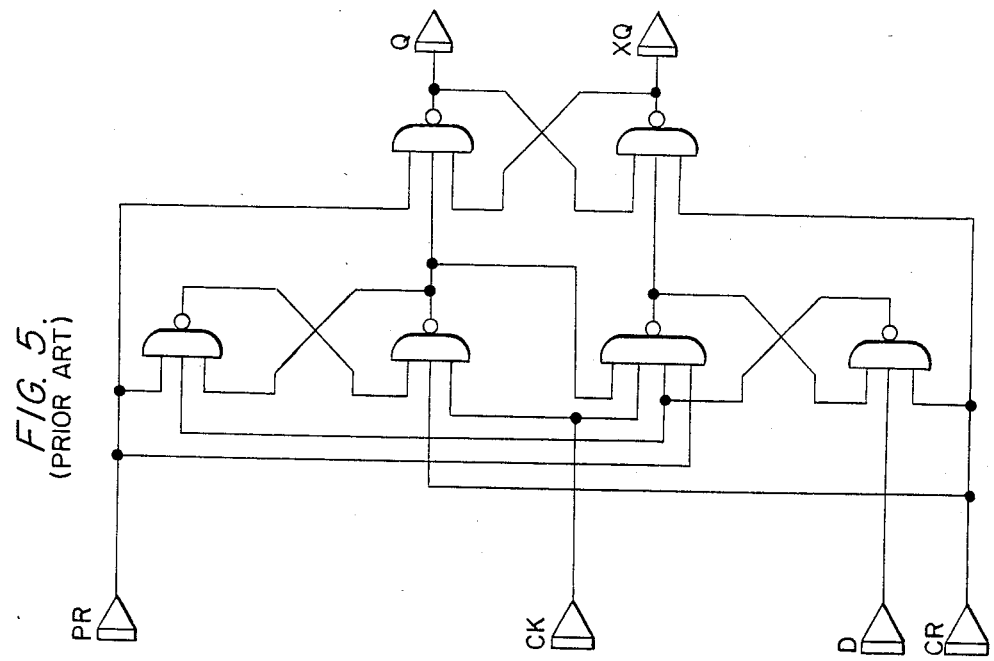
FIG. 5 is a logic diagram of another example of a macro cell, i.e., a D-type flip-flop.

FIG. 5 is a logic diagram of another type of macro cell. This macro cell comprises 6 basic cells, i.e. NAND gates, which are connected together so as to exhibit a logic function which, in this case, is a D-type flip-flop function. In FIG. 5, D is a data input, CK is a clock, CR is a clear, PR is a preset, Q is an output, and XQ is a complementary output.

Figure 6:
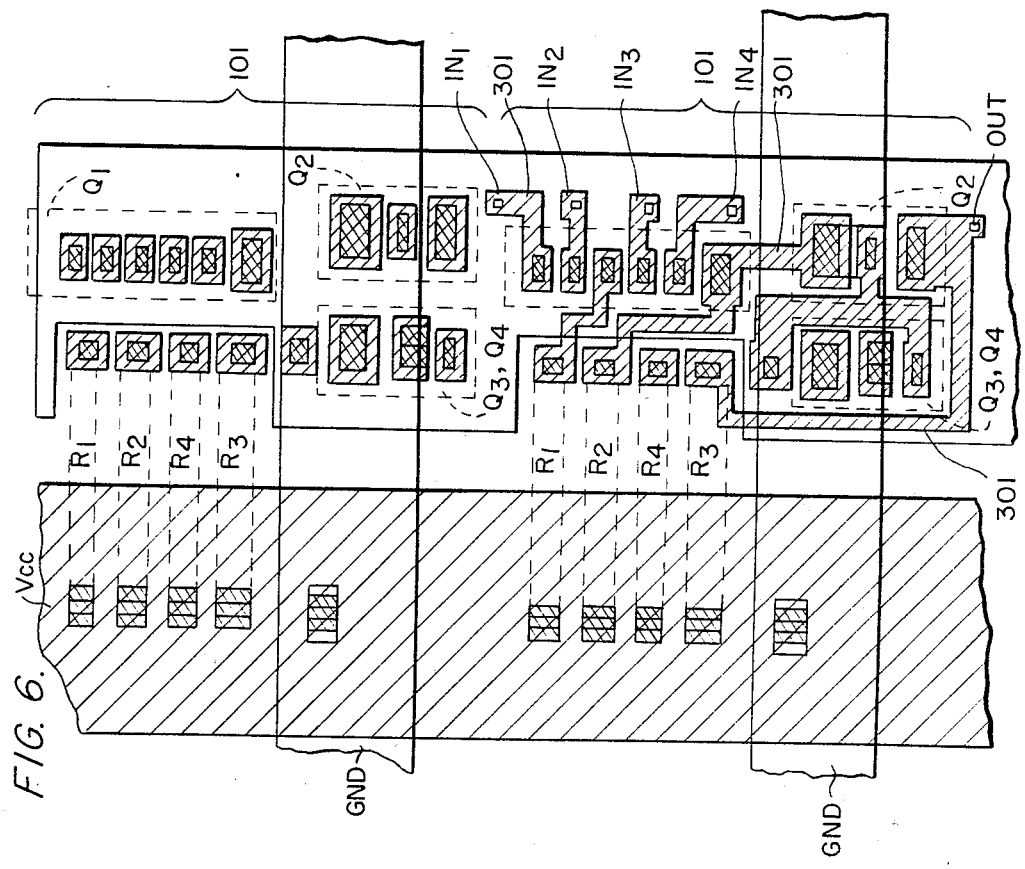
FIG. 6 is a plan view of the macro cell of FIG. 4.

FIG. 6 is a plan view of the wiring pattern for the macro cell of FIG. 4. In FIG. 6, the conductive wiring 301 is provided for connecting the electric elements (e.g. transistors and resistors) in the basic cell 101.

FIG. 7 is a plan view of the wiring pattern of the macro cell of FIG. 5. In FIG. 7, conductive wiring 301 connects the electrical elements in 6 basic cells 101. In FIG. 7, the detailed circuitry of the basic cells 101 is omitted.

Figure 8:
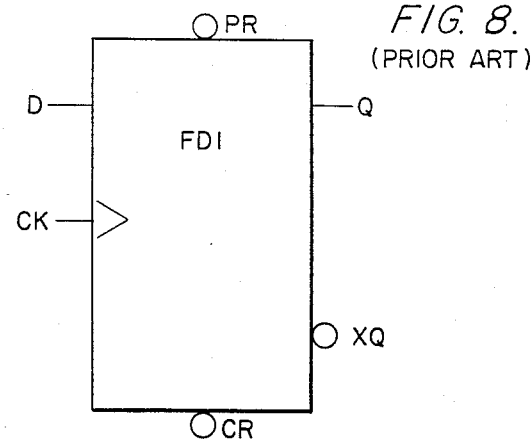
FIG. 8 is an illustration of a symbol representing the macro cell of FIG. 5.

FIG. 8 is a symbol for identifying the macro cell of FIGS. 5 and 7, and includes a symbol name "FD1", input terminals and output terminals. FIG. 4, as well as being a logic diagram itself, is a symbol for identifying the macro cell of FIG. 6.

As explained above, unlike the basic cell 101, which includes unconnected electrical elements, the macro cell comprises one or more basic cells 101 and conductive wiring for interconnecting the electric elements, e.g., transistors, diodes and resistors, in the basic cells 101. Therefore, the macro cells each have some logic function, e.g., a 3-input NAND gate function, a D-type flip-flop function, etc. . . . The logic functions of the macro cells are generally simple and do not require a large number of basic cells 101. Examples of macro cells having particular logic functions, and the number of basic cells required to provide this function are listed in Table 1 below. In these examples, the macro cell units have no more than 12 basic cells. Therefore, the number of electric elements required to form any of these macro cells is less than 100.

TABLE 1

| Logic Function | Number of the Basic Cells |
|---|---|
| Stack at "L" | 1 |
| Stack at "H" | 1 |
| Inverter | 1 |
| 2-input NAND | 1 |
| 3-input NAND | 1 |
| 4-input NAND | 2 |
| 5-input NAND | 2 |
| 6-input NAND | 2 |
| 7-input NAND | 3 |
| 8-input NAND | 3 |
| 9-input NAND | 3 |
| 10-input NAND | 4 |
| 11-input NAND | 4 |
| 12-input NAND | 4 |
| Buffer | 2 |
| 2-input AND | 2 |
| 3-input AND | 2 |
| 4-input AND | 2 |
| 5-input AND | 2 |
| 6-input AND | 2 |
| 7-input AND | 3 |
| 8-input AND | 3 |
| 9-input AND | 3 |
| 10-input AND | 4 |
| 11-input AND | 4 |
| 12-input AND | 4 |
| Exclusive OR | 4 |
| Exclusive NOR | 4 |
| 2-input 2-wide AND-NOR | 2 |
| 3-input 2-wide AND-NOR | 2 |
| 4-input 2-wide AND-NOR | 4 |
| 5-input 2-wide AND-NOR | 4 |
| 6-input 2-wide AND-NOR | 4 |
| 2-input 3-wide AND-NOR | 3 |
| 3-input 3-wide AND-NOR | 3 |
| 4-input 3-wide AND-NOR | 6 |
| 5-input 3-wide AND-NOR | 6 |
| 6-input 3-wide AND-NOR | 6 |
| 2-input 4-wide AND-NOR | 4 |
| 3-input 4-wide AND-NOR | 4 |
| 4-input 4-wide AND-NOR | 8 |
| 5-input 4-wide AND-NOR | 8 |
| 6-input 4-wide AND-NOR | 8 |
| 2-input NOR | 2 |
| 3-input NOR | 3 |
| 4-input NOR | 4 |
| S-R Latch | 2 |
| Gated S-R Latch with Clear and Preset | 4 |
| D-Latch with Clear | 4 |
| D-Latch with Clear and Preset | 4 |
| D-type Flip-Flop | 6 |

TABLE 1-continued

| Logic Function | Number of the Basic Cells |
| --- | --- |
| 2-wide 2-input D-type Flip-Flop | 8 |
| J-XK type Flip-Flop | 8 |

According to the method of the present invention, a second step in the manufacturing process is a step of storing, in a memory, symbol data representing the available symbols (e.g. FIGS. 4 and 8) and storing corresponding detailed data regarding the connection of the electric elements in the basic cells 101 of the macro cells and the logic functions for the macro cells. In reality, this detailed data comprises data representing the conductive wiring pattern (e.g. FIGS. 6 and 7) for interconnecting the transistors $Q_1$, $Q_2$, diodes $Q_3$, $Q_4$, resistors $R_1$, $R_2$, $R_3$, and the power supplies Vcc, GND in the basic cells 101. As explained above, the macro cells have various predetermined wiring patterns therein, respectively, so that data representing the wiring patterns for all standard macro cells are stored.

Figure 9:
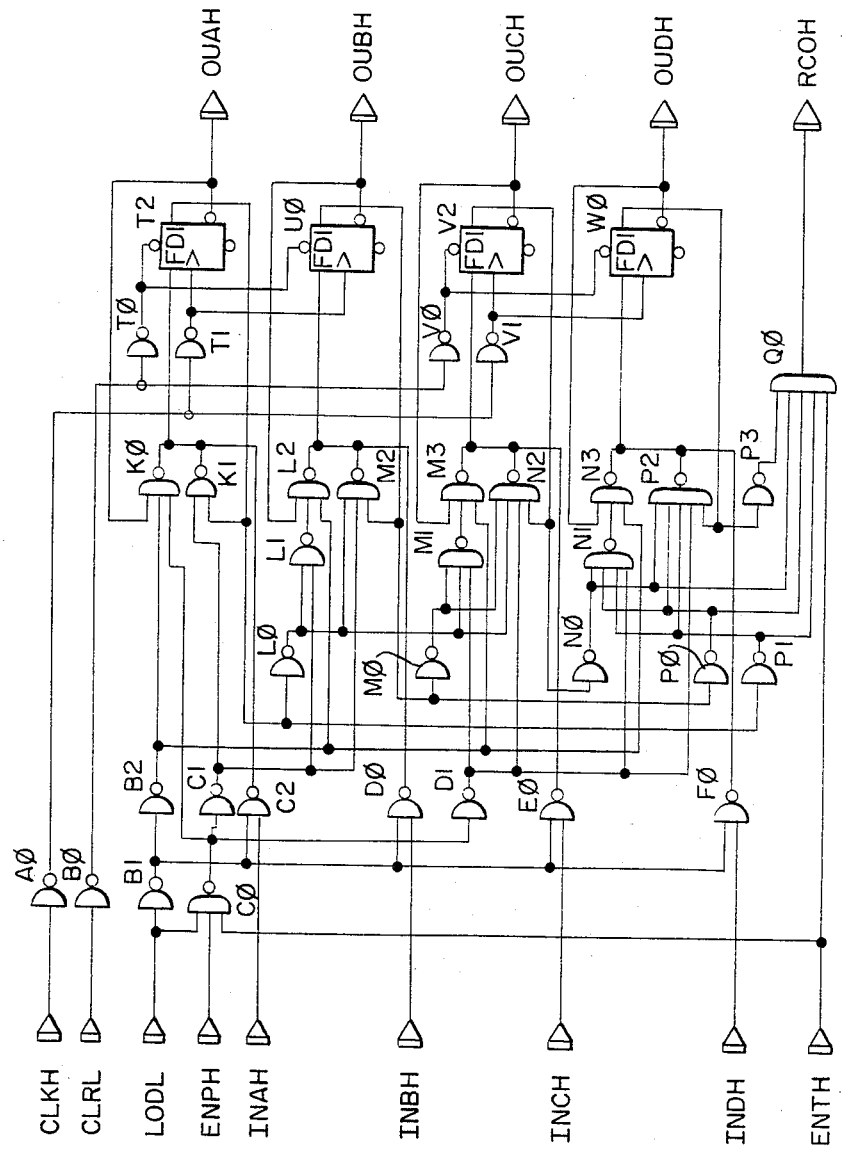
FIG. 9 is a logic diagram of an example of a standard expanded macro cell.

FIG. 9 is a logic diagram of one of the expanded macro cells which comprise plural macro cells connected together by wiring. A$\phi$, B$\phi$, B1, B2, C$\phi$, C1, C2, D$\phi$... V1, V2, W$\phi$, are respectively macro cells which form the expanded macro cell. Some of the macro cells comprise only one basic cell, others e.g. N1, N2, P2, Q$\phi$, T2, U$\phi$, V2, W$\phi$, comprise plural basic cells. The total number of macro cells is 37, and the total number of basic cells is 61. CLKH, CLRL, LODL, ENPH, INAH, ... OUCH, OUDH, RCOH are accessible terminals of the expanded macro cell for interfacing with an external circuit. The expanded macro cell of FIG. 9 has, as a logic function, a synchronous 4-bit counter function, which is a standard type of logic function. FIG. 10 illustrates a symbol for identifying the expanded macro cell of FIG. 9. As shown in FIG. 10, the shape of this expanded macro cell symbol 400 is a rectangle, and the name of this particular expanded macro cell is, "F161", thereby readily identifying the logic function as well as the expanded macro cell. This name is placed approximately at the center of the rectangle, and an index mark 401 indicates the orientation of the symbol 400 and appears at the top of the rectangle. The symbol 400 also includes the accessible terminals which can be used to interface with external macro cells and/or other expanded macro cells, and these accessible terminals have names for indicating the nature and property of the signals, for example, CLRL, CLKH, INAH, INBH, INCH, INDH, ENPH, RCOH, OUAH, OUBH, OUCH, OUDH, ENTH, LODL. The names of the expanded macro cells uniquely consist of a maximum of 4 characters, e.g., "F161," and all of the names of the accessible terminals also uniquely consist of 4 characters, the last character of which is used to indicate whether the terminal is used as active-high or active-low, e.g. "H," "L." The only exceptions to this are the terminals "VCC," "GND," and "N.C." (which indicates "not connected," i.e., inaccessible terminals). Further, the distance between two terminals is identical to other terminal-to-terminal distances throughout an entire terminal assignment.

According to the method of the present invention, the third step is a step for storing, in a memory, symbol data representing the expanded macro cell symbols (FIG. 10), and also storing corresponding detailed data, including information about the connection of the macro cells which form the expanded macro cell, and about the logic functions. Particularly, this detailed data includes, for each expanded macro cell, data identifying the macro cells which form the expanded macro cell, the terminals for interfacing the connections of these macro cells and the external terminals for connection to other expanded macro cells (see FIG. 9).

Figure 11:
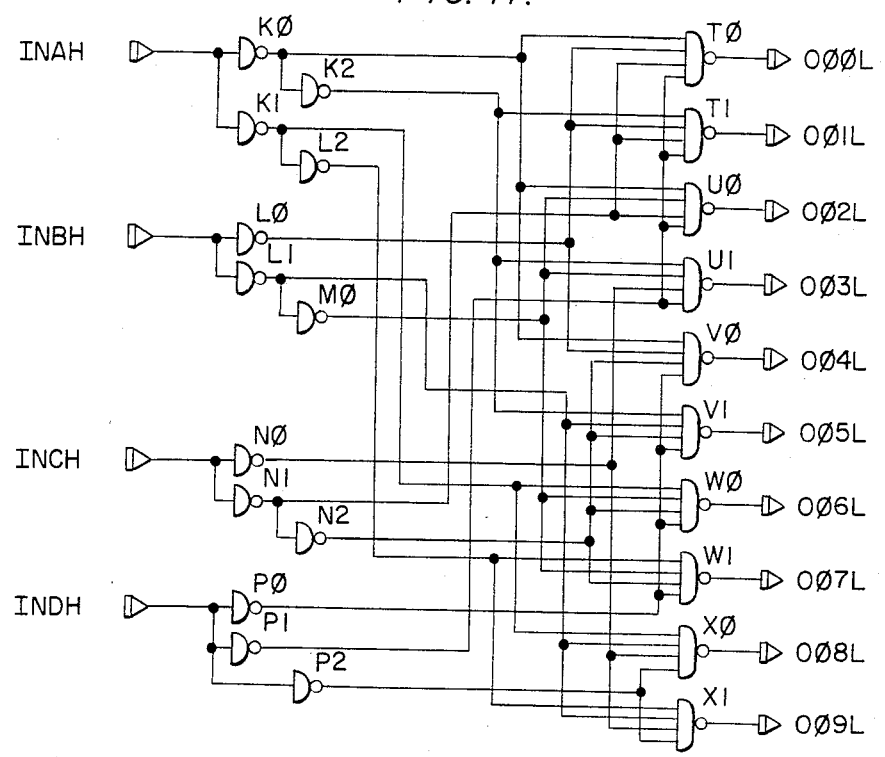
FIG. 11 is a logic diagram of another example of a standard expanded macro cell.
Figure 12:
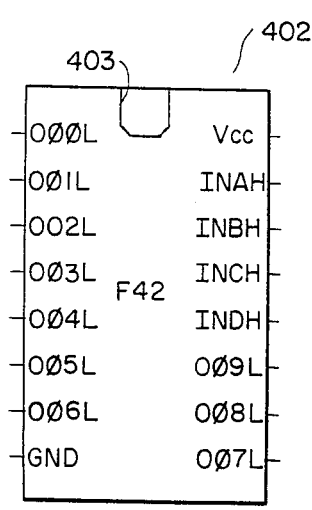
FIG. 12 is an illustration of a symbol representing the expanded macro cell of FIG. 11.

FIGS. 11 and 12 are, respectively, a logic diagram and a symbol for another example of an expanded macro cell. Each of the 13 macro cells K$\phi$, K1, K2, L$\phi$, L1, L2, M$\phi$, N$\phi$, N1, N2, P$\phi$, P1 and P2, comprises a single basic cell, and each of the 10 macro cells T$\phi$, T1, U$\phi$, U1, V$\phi$, V1, W$\phi$, W1, X$\phi$, X1 comprises 2 basic cells. Therefore, this expanded macro cell comprises 23 macro cells (formed by 33 basic cells) connected together, and it has, as a logic function, a 4-line to 10-line decoder function which is a standard and common logic function. Regarding the symbol 402 in FIG. 12, the name of this expanded macro cell ("F42") and the names of the terminals correspond to those in FIG. 10.

An important feature of the expanded macro cells which include plural macro cells, is that the logic functions of the expanded macro cells are more complex and more sophisticated than those of the macro cells. However, the logic functions of the expanded macro cells are very standardized in this technological area, e.g., integrated logic circuit technology and logic system design technology. As disclosed in "The TTL Data Book for Design Engineers," by Texas Instruments Incorporated, there are standard-technology TTL circuit devices, e.g., Series 54/74, Series 54H/74H, Series 54LS/74LS, and Series 54S/74S, which are very familiar to design engineers. As disclosed in this book, many integrated logic circuit device companies manufacture the same logic function devices as the standard-technology TTL circuit devices disclosed in the above book.

In Table 2, examples of standard expanded macro cells, including names and their corresponding logic functions is set forth. The expanded macro cells in Table 2 comprise at least 13 basic cells and 4 macro cells. In addition, they comprise at least 100 electric elements. Therefore, the expanded macro cell can also be defined as an MSI (Medium Scale Integrated Circuit) macro cell, which means that the scale of this macro cell is the same as MSI.

TABLE 2

| Name | Logic Function | Number of the Basic Cells |
| --- | --- | --- |
| | DECODER/DEMULTIPLEXER | |
| F42 | 4-line to 10-line | 34 |
| F154 | 4-line to 16-line | 59 |
| | DATA SELECTOR/MULTIPLEXER | |
| F150 | 1-of-16 | 78 |
| F151 | 1-of-8 | 37 |
| F153 | Dual 4-line to 1-line | 34 |
| F157 | Quad 2-line to 1-line | 17 |
| F158 | Quad 2-line to 1-line | 13 |
| F352 | Dual 4-line to 1-line | 32 |
| | SHIFT REGISTER | |
| F91 | Serial-in, serial-out, 8-bit | 54 |
| F164 | Serial-in, parallel-out, 8-bit | 59 |
| F166 | Parallel/serial-in, serial-out, 8-bit | 79 |
| F194 | 4-bit, bidirectional universal | 53 |
| F195 | 4-bit, parallel-in, parallel-out | 41 |
| F198 | 8-bit, bidirectional universal | 101 |
| F199 | 8-bit, parallel-in, parallel-out | 81 |
| | COUNTER | |
| F160 | 4-bit synchronous decade, | 60 |

TABLE 2-continued

| Name | Logic Function | Number of the Basic Cells |
|---|---|---|
| F161 | 4-bit synchronous binary, with direct clear | 61 |
| F162 | 4-bit fully synchronous decade | 61 |
| F163 | 4-bit fully synchronous binary | 62 |
| F190 | 4-bit synchronous decade, with up/down mode control | 86 |
| F191 | 4-bit synchronous binary, with up/down mode control | 82 |
| PARITY GENERATOR/CHECKER | | |
| F180 | 8-bit odd/even | 37 |
| F280 | 9-bit odd/even | 42 |
| ARITHMETIC ELEMENT | | |
| F80 | 1-bit gated full adder | 15 |

As illustrated in FIGS. 10, 12 and in the above book, "The TTL Data Book for Design Engineers," a significant feature of the symbols for the expanded macro cells is that a portion of the name of each expanded macro cell, e.g., "F161," "F42" is identical to the name of the standard-technology TTL circuit devices, e.g., "SN74LS161" "SN74LS42" to which the expanded macro cell corresponds, thereby providing easy identification of the logic functions of the expanded macro cells. In addition, the order of the accessible and inaccessible terminals is the same as for the standard-technology TTL circuit device. An additional example of a symbol for an expanded macro cell is shown in FIG. 13.

Figure 13:
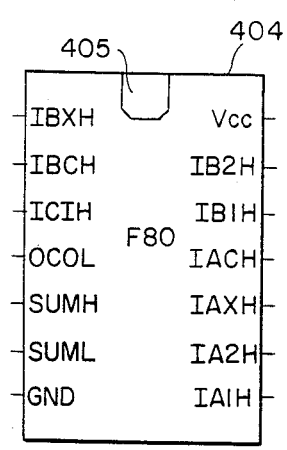
FIG. 13 is an illustration of a symbol for representing still other expanded macro cell.
Figure 14:
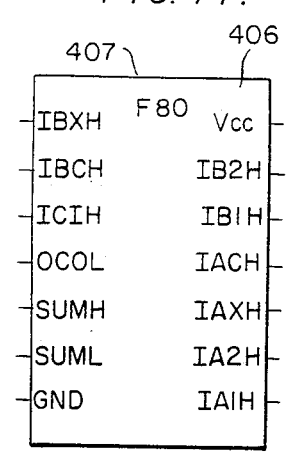
FIG. 14 is an illustration of another type of symbol for representing the expanded macro cell of FIG. 13.

FIG. 14 illustrates an alternate type of symbol for representing the expanded macro cell of FIG. 13. One difference between the expanded macro cell symbols 404 (FIG. 13) and 406 (FIG. 14) is that, in the symbol 406, the name 407 (i.e., "F80") appears at the top of the rectangle instead of the index mark 405 which appears in the symbol 404. Therefore, the name 407 not only identifies the logic function of the expanded macro cell, but also indicates the orientation of the symbol 406.

FIGS. 16A-D form a logic diagram for an example of a logic system. This logic diagram comprises only symbols for macro cells WO, X3, and for expanded macro cells 500, 501, 502, 503, the connections thereof, and the input/output terminals, but does not include complex logic diagrams for the logic within the expanded macro cells. This logic diagram also includes the Input/Output Buffers Dϕ, Eϕ, Mϕ, Nϕ, etc. The logic system of FIGS. 16A-D can be provided on one chip.

According to the method of the present invention, the fourth step is a step for storing, in a memory, logic system data including symbol data for the macro cells and the expanded macro cells, as well as the information for the connection of the macro cells and the expanded macro cells.

The next step in the method of the present invention is the step of synthesizing the logic system data and the detailed data for the macro cells and the expanded macro cells into conductive wiring pattern data, and forming a conductive wiring pattern for the semiconductor substrate to interconnect the electrical-elements in the basic cells together. This conductive wiring pattern data also sets forth the interconnection of the basic cells, input/output buffers, and input/output pads, and includes the connections to Vcc and GND.

Thus, by using the method of the present invention, the integrated circuit device for a logic system having very complicated logic circuits, a large number of gates, and a large number of electric elements, can be manufactured.

Figure 18:
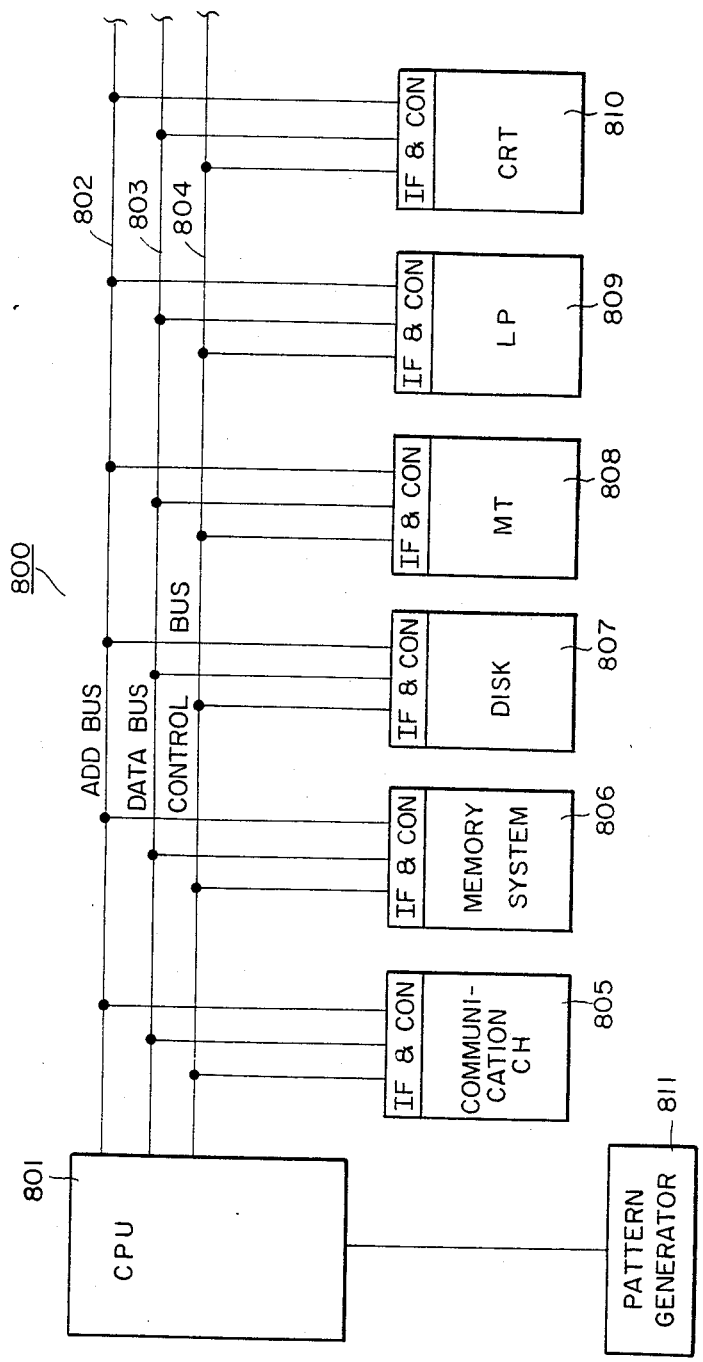
FIG. 18 is a schematic block diagram of a CAD (computer aided design) system for implementing the method of the present invention.

FIG. 18 is a block diagram of a CAD (Computer Aided Design) system 800 for performing the method of the present invention. In the CAD system 800, a CPU 801 is connected to peripheral apparatus, including a communication channel 805, a memory system 806, a disk memory 807, a magnetic tape memory 808, a line printer 809, and a CRT 810, via an address bus 802, a data bus 803, and a control bus 804. Each of the peripheral apparatus 805, 806, 807, 808, 809, 810 comprises its own interface circuit and controller therein (IF & CON) for communicating with the CPU 801.

The symbol data and detailed data for the macro cells and the expanded macro cells are stored in a first memory means comprising the disk memory 807 or the magnetic tape memory 808 which are semi-permanent memory apparatus. On the other hand, the logic system data is stored in a second memory means comprising memory system 806. Unlike the disk or magnetic tape memories 807, 808 which are commonly known to have long access time, the memory system 806 can be accessed much faster. The logic system data is always different because it depends upon the logic system which the system designer creates. On the other hand, the symbol data and the detailed data are always the same; in other words, there is no change in the symbol data and the detailed data.

In practice, the second memory means 806 is more expensive than the first memory means 807, 808. According to the present invention, however, the data stored in the second memory means 806 is only the logic system data (i.e. only symbol data for the macro cells and the expanded macro cells, and the connections thereof), and not detailed data. Therefore, the area which is required for storing the logic system data in the memory 806 can be very minimal.

Figure 19:
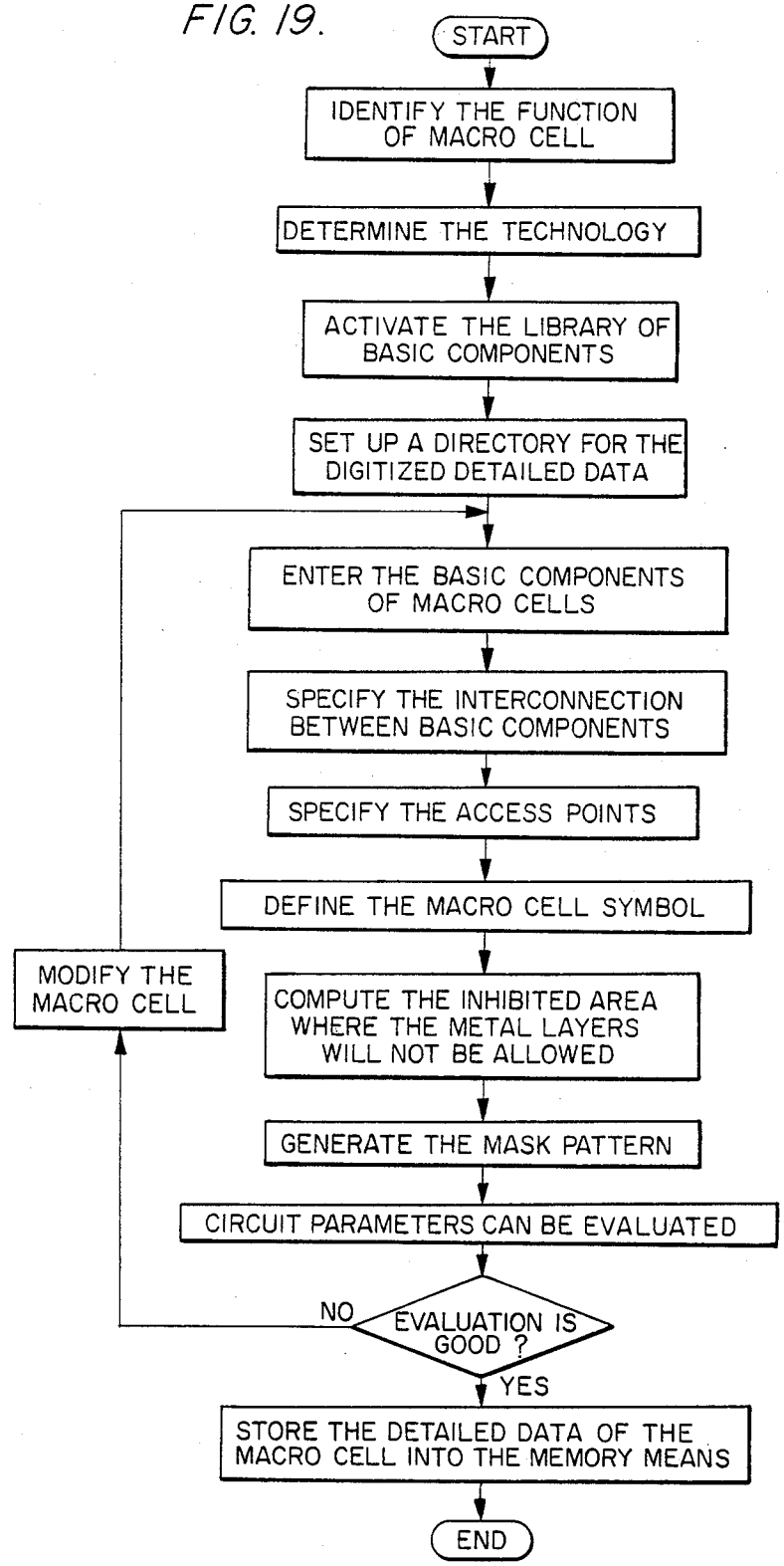
FIGS. 19, 20, 21, 22A, 22B and 23 are flow charts for the program steps for carrying out the steps of the method of the present invention under the control of the system of FIG. 18.

FIG. 19 is a flow chart for a program for generating a data base for the detailed data representing each standard macro cell for storage in disk memory 807 or magnetic tape memory 808. In order to generate this data base, for example, a conventional graphics system can be used (e.g. the DESIGNER IV graphics system by Computer Vision Co. or the GDSII graphics system by Calma Co.). The program steps are outlined by the flow chart set forth in FIG. 19. First, the logic function of a macro cell for which detailed data is to be generated is specified, and the specific type of technology is selected from several gate array integrated circuit technologies. A library in the memory, which stores data for the basic components (e.g. electric elements, transistor, resistor, diode, conductive wiring) is activated, and a directory (e.g. designating the space in the memory for storing the digitized detailed data) is set up.

The next step is the entry of the basic components of the basic cells which form the macro cell. This step comprises entering identifiers for the basic cells and data representing the types of basic cells. For example, in one basic cell, all of the electric elements are used to form a 3-input NAND gate, while in another basic cell, only the input transistor is used to form additional input means for other basic cells. In addition, the input/output terminal for each basic cell is entered. Next, the conductive wiring pattern which interconnects the electric elements and/or the input/output terminal of the basic cells is specified. After that, the access points (i.e. terminals) of the macro cell are specified and the symbol for the macro cell is defined. These access points are used for interconnecting the macro cell to other macro cells or expanded macro cells.

Based on the above data, the actual mask pattern for the wiring layers of each standard macro cell which could be used in an integrated circuit device can be generated. The actual mask pattern is readily generated on the basis of the detailed data because the detailed data is so specific that it is almost at the same level as the mask pattern level and because the mask can be defined using data representing connected straight lines. Referring to the inside of the macro cell, before generating the mask pattern the inhibited area where the conductive wiring, i.e. metal pattern, will not be allowed is computed, and after the generation of the mask pattern, the circuit parameters of the macro cell are evaluated. These circuit parameters include, for example, the delay time, hold time, set-up time, etc. . . . which are necessary information for system design using the macro cells. If the result of the evaluation is good, the generated mask pattern data, the basic cell data, the access point data and the circuit parameters are stored in the disk memory 807 or the magnetic tape memory 808 (see FIG. 18) as detailed data for the macro cell. The mask pattern data and the access point data are graphic data which is digital data representing the actual mask pattern. The graphic data comprises precise data from which the actual mask pattern can be readily drawn. If the result of the evaluation is unacceptable, the macro cell is modified until an acceptable evaluation is obtained. The stored detailed data is maintained for read out as often as it is needed.

Figure 20:
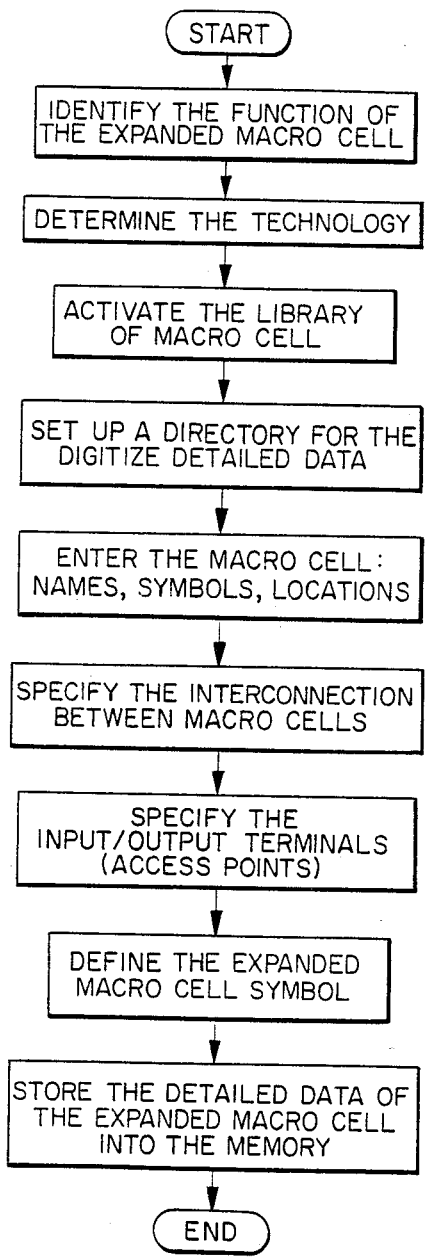

FIG. 20 is a flow chart for the program steps for storing the detailed data for an expanded macro cell to generate a data base for the standard expanded macro cells. As with the storage of the detailed data for the macro cell (FIG. 19), the same conventional graphics system (e.g., the above-mentioned DESIGNER IV or GDSII systems) can be used. First, the function of the expanded macro cell for which data is to be stored, is identified, thereby determining the technology and activating the library for the macro cells. A directory for the digital detailed data of the expanded macro cell is set up, and the information for the macro cells which form the expanded macro cell, is entered. This information includes the name (for identification), the symbol, the logic function and the location within the expanded macro cell as a whole. Next, the interconnections (see FIG. 9) between the macro cells in the expanded macro cell are specified, as well as the input/output terminals of the expanded macro cell for the access points from the outside. Further, the symbol for the expanded macro cell is defined.

At this stage, all of the data for generating the logic diagram (see, e.g., FIG. 9) is stored as the detailed data of the expanded macro cell; thus, this data includes graphic data for the logic diagram. This detailed data for the expanded macro cell is stored in the disk memory 807 or magnetic tape memory 808 and maintained for read-out as often as needed.

Unlike the macro cell (the detailed data of which includes the predetermined wiring pattern), the expanded macro cell does not require this type of predetermined wiring pattern data to be included in its detailed data, but has only interconnection information representing the connections between the macro cells, i.e. the interconnections at the logic diagram level (see, e.g., FIG. 9). Therefore, the actual wiring pattern of the expanded macro cell will be flexibly generated depending upon the nature of the detailed data for the macro cells forming the expanded macro cell.

Figure 21:
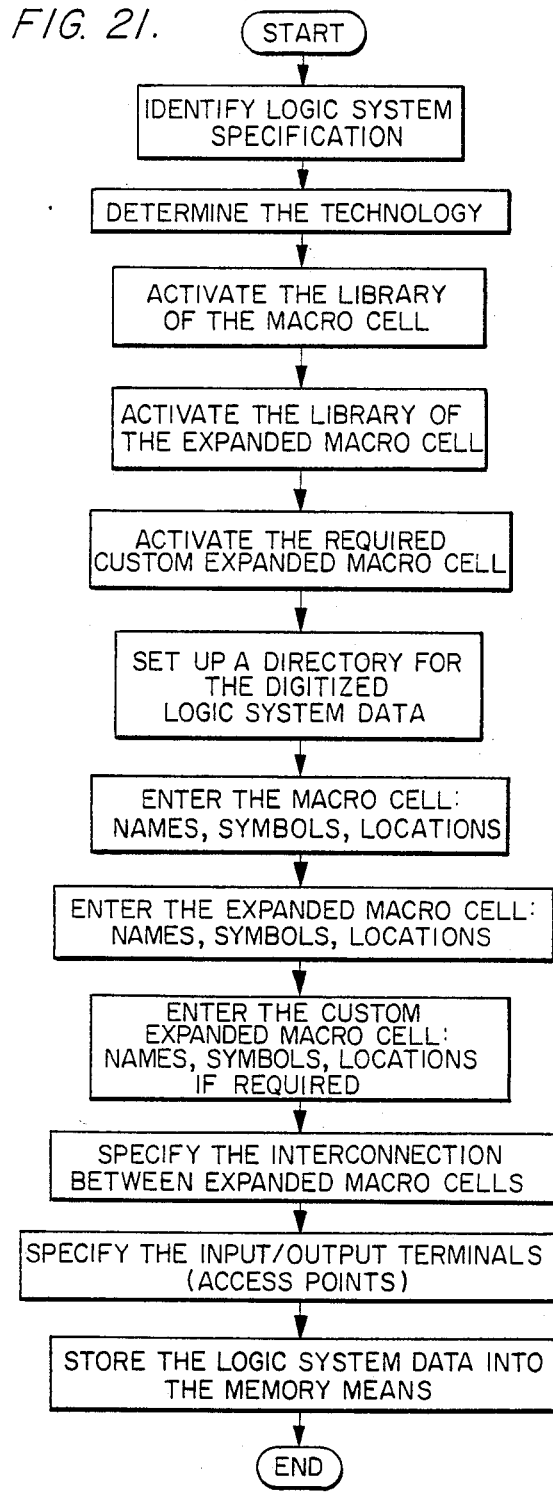

FIG. 21 is a flow chart for the program steps for storing the logic system data. Again, a standard graphics system (e.g., the above-mentioned DESIGNER IV or GDSII systems) can be used for this step. After the logic system is identified, the technology is determined and the libraries of the macro cells and the expanded macro cells (which are stored in the disk memory 807 and the magnetic tape memory 808) are activated. Then the directory for the digital logic system data is set up. After that, the macro cells and expanded macro cells which are used in the logic system, are entered, by inputting information including the name, symbol and location for each macro cell and expanded macro cell. (Here, the macro cells which must be specified are only those which are not included within a specified expanded macro cell). Next, the connections of the macro cells and the expanded macro cells are specified (e.g., see FIGS. 16A–D); and the input/output terminals which will correspond to the I/0 pads of the chip are specified. In this storage step, it is easy for the designer to specify the connections of the macro cells and expanded macro cells, because the designer does not have to be concerned with the internal circuitry of the macro cells and the expanded macro cells. In addition, since the macro cells and the expanded macro cells have standard logic functions which are commonly known to designers in this art, the macro cells and expanded macro cells can be readily assembled to create an entire logic system. This also makes it easy to ensure the logic flow of the whole logic system. Finally, the logic system data, which is digitized and stored in the memory system 806, is at the logic diagram level. The digitizing step is simply the step of converting the information concerning the expanded macro cell name, symbol and location, I/O terminals and the connections, into corresponding digital data.

Figure 22B:
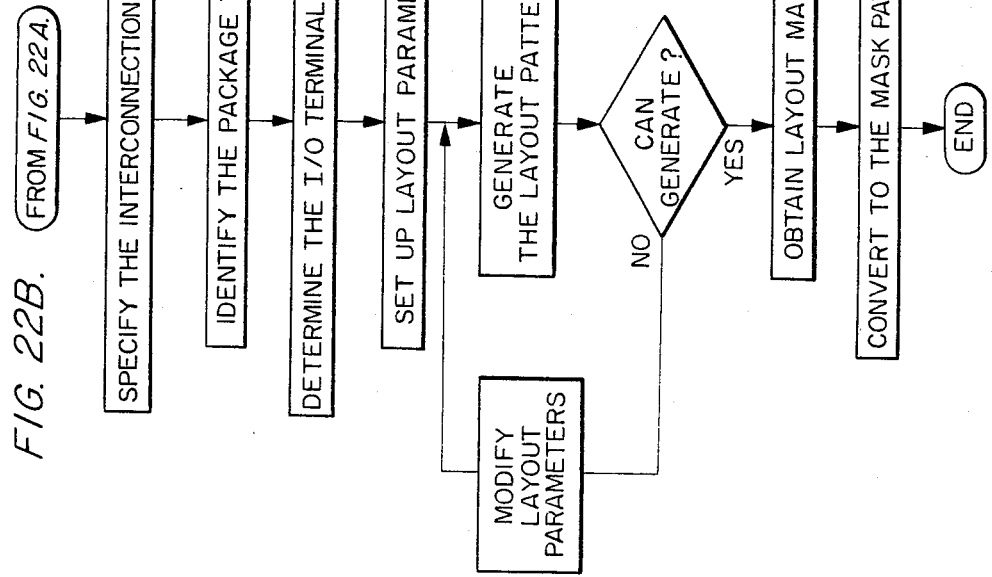
Figure 22A:
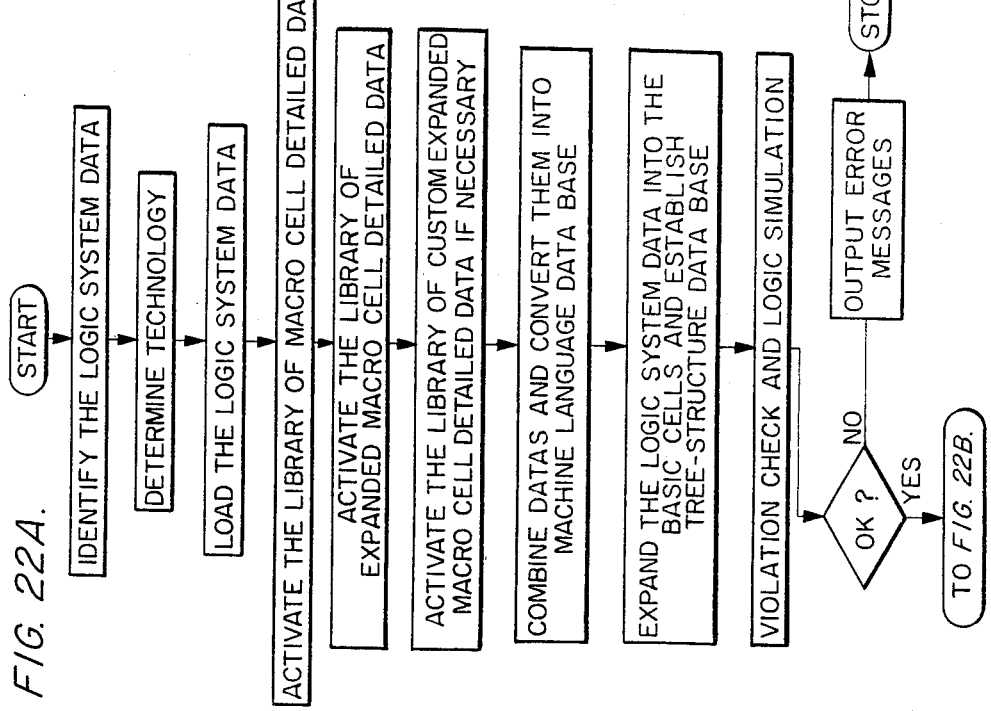

FIGS. 22A, 22B are flow charts for the program steps performed by the CPU 801 in generating the conductive wiring pattern after the logic system data is stored in the memory system 806.

First, the logic system data is identified, the technology is determined and the CPU 801 loads the logic system data from the memory system 806 and activates the libraries for the detailed data for the macro cells and expanded macro cells.

The next step for the CPU 801 is to combine three sets of graphic data, i.e. the detailed data for the macro cells, the detailed data for the expanded macro cells, and the logic system data. This combined graphic data is converted into a machine language data base which the CPU 801 can understand.

As explained above, although detailed data for the macro cells comprises graphic data representing the actual wiring pattern, this detailed data additionally includes the graphic data for a logic diagram which contains only NAND gates, i.e. the NAND gate implementation of the simplest macro cell. Therefore, the next step is to expand the logic system data into NAND gates and to establish a tree-structure data base which comprises the NAND gates and the connections thereof. In the next step, the tree-structure data base is used for a violation check and logic simulation. The violation check looks for open terminals, fan-in, fan-out, driving factor, basic cell locations, total basic cell count, power dissipation and so forth. The logic simulation ensures that the output result, based upon the input data prepared by the designer, is the same as the output data expected by the designer. If the result of these checks is unacceptable, the CPU 801 outputs an error message. If the result is acceptable, the CPU 801 proceeds to the next step.

Prior to synthesizing the data, information necessary for the synthesis is determined. For example, an interconnection parameter (which is a rule for interconnection) is specified; the package type used for the logic system is identified; and the assignment of the input/output terminals is determined.

Based on the machine language data base of the combined data and the above information, the CPU 801 sets up the layout pattern parameters from which the actual mask layout pattern can be generated. Next, the layout pattern is generated based upon the layout pattern parameters. In this step, if the CPU 801 cannot generate the appropriate layout pattern (i.e., by using standard CAD techniques), the layout parameters (i.e. the above information) are modified. After the generating step, a layout map (similar to FIG. 7) which is a kind of image of the actual mask pattern, is provided. Then, the layout map is converted into the actual mask pattern i.e. the conductive wiring pattern (see e.g. FIG. 6) by a pattern generator 811. The pattern generator 811 can be any standard mask pattern generator, for example the model PG3600 by GCA. Once the pattern generator 811 has generated the actual mask pattern, the actual wiring can be readily deposited on the chip. Of course, once the CPU 801 has generated the layout map, there are a number of possible ways to process the layout map data. For example, the layout map data could be stored on a magnetic tape or disk which could then be transported for use with a pattern generator 811. Alternatively, the layout map data generator by the CPU 801 could be used to define the wiring pattern by using a light beam (for example, an ultraviolet light beam) and an acousto-optic modulator for modulating the light beam in dependence upon the layout map data.

Figure 17A:
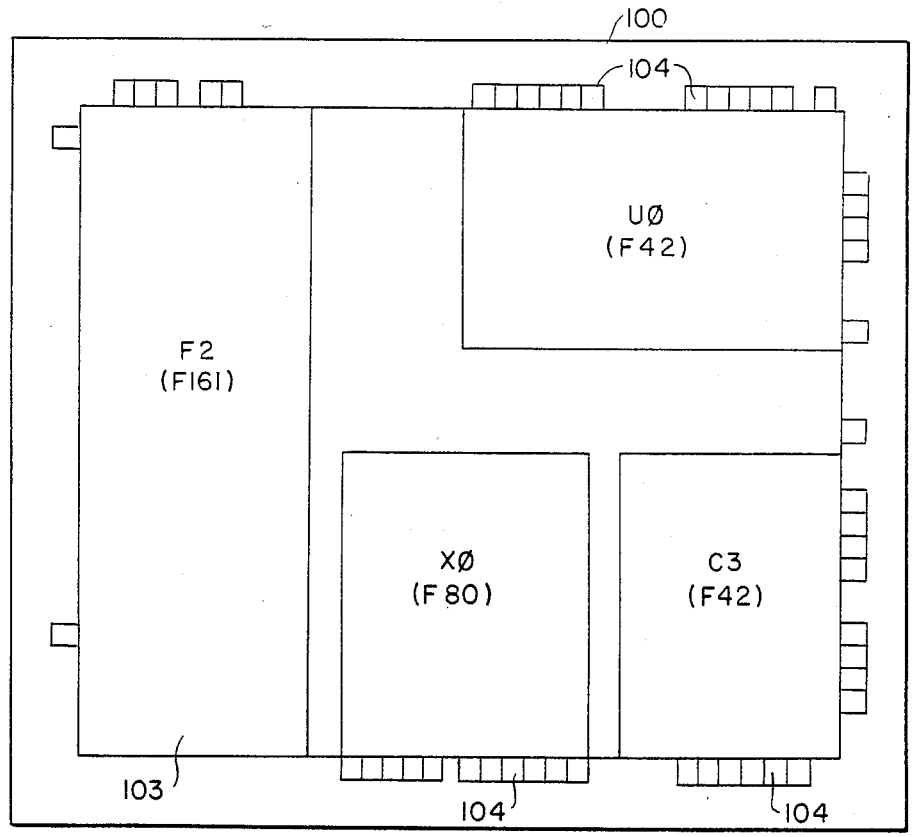
FIG. 17A is a schematic plan view of an example of a chip layout.
Figure 17B:
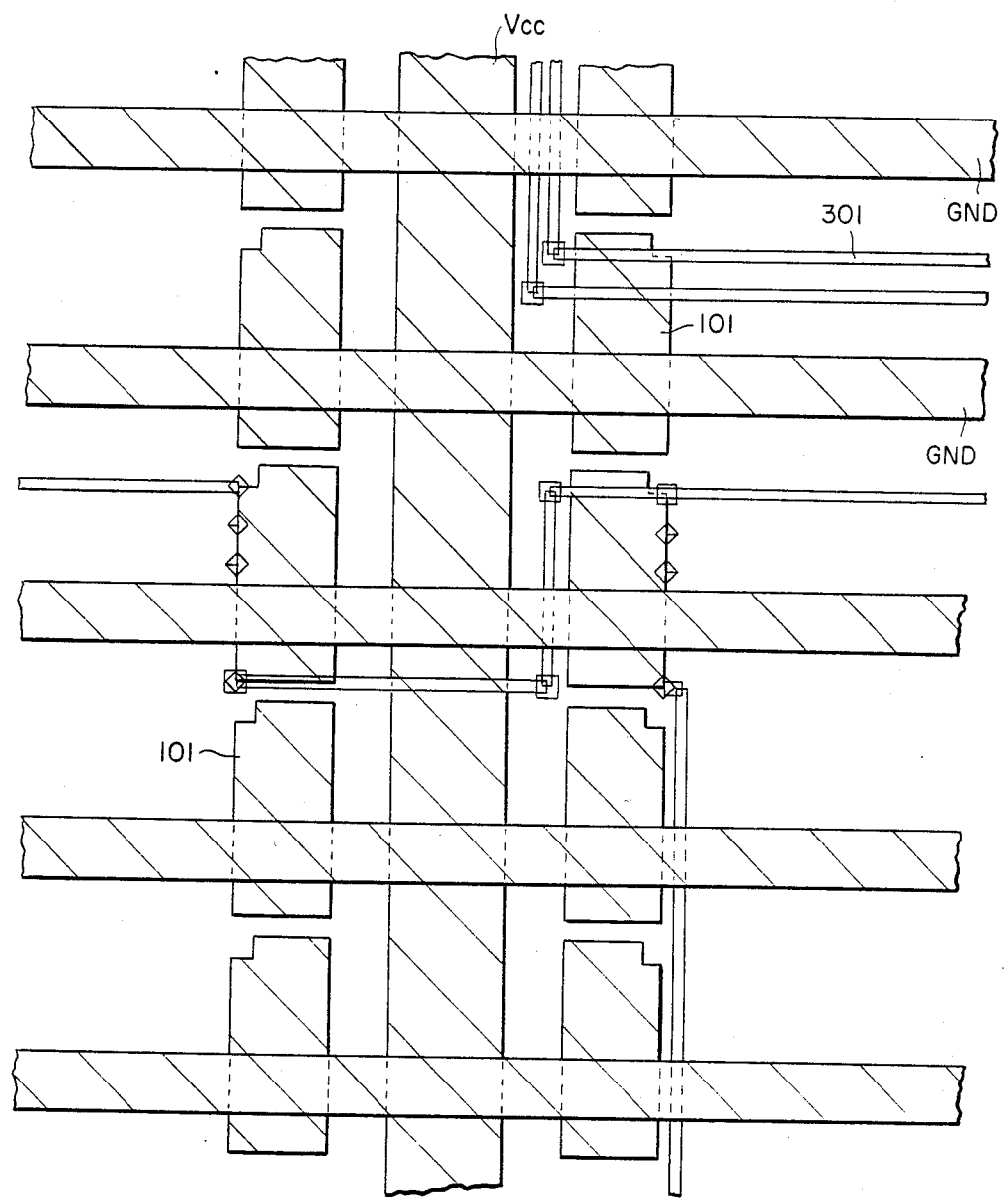
FIG. 17B is a schematic view of the layout map for the conductive wiring pattern on the semiconductor substrate of FIG. 1.

FIG. 17A illustrates schematically an example of a chip layout for a logic system in accordance with a conductive wiring pattern generated by the method of the present invention; where input/output buffers 104 are located about the periphery of the basic cell array area 103. As shown in FIG. 17A, each expanded macro cell (F161, F80, F42,) is located in the array area 103. FIG. 17B is a schematic plan view of the wiring pattern corresponding to an example of the wiring pattern for a portion of the layout map of FIG. 17A.

As explained above, the expanded macro cells of the present invention are more complex and functionally sophisticated than prior art macro cells. In addition, they have the most commonly known and standardized logic functions. Since the expanded macro cells include numerous basic cells connected together, they sometimes have poor gate usage efficiency, depending on the particular logic system. There is no efficiency or redundancy problem if the expanded macro cells used by customers or designers in the logic system are exactly the same as the standard expanded macro cells in the library. However, poor efficiency in use of the expanded macro cells will occur when designers want to use circuits in the logic system which are not the same as the standard expanded macro cells; for example, where only part of the expanded macro cell, (e.g., one of the terminals, wirings, or macro cells in the expanded macro cell is not used) is used. In that situation, there will also be waste of the area on the semiconductor substrate, because the area which will actually be used in the expanded macro cell is smaller than the prepared area which the expanded macro cell will occupy on the semiconductor substrate.

According to a second embodiment of the present invention, the systems designer is allowed to alter part of the expanded macro cell in order to optimize the logic function, the circuit performance, and the usage of area. Particularly, if the input and output terminals of a standard expanded macro cell are not to be used entirely, it is recommended that the unused terminals and wiring (and the macro cells which are attached to the unused terminals) be eliminated. This kind of flexibility in altering the standard expanded macro cell improves its effective use of the occupied area thereof, and also the power consumption and electrical characteristics. When at least one terminal, wiring, or macro cell is eliminated from a standard expanded macro cell, the expanded macro cell is altered to form a custom expanded macro cell.

Figure 15:
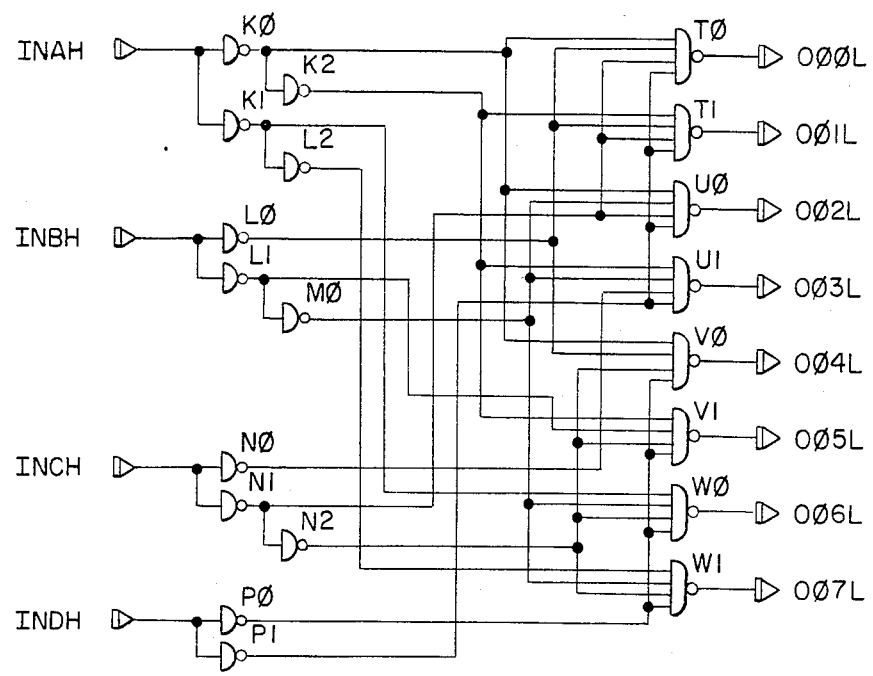
FIG. 15 is a logic diagram of an example of a custom expanded macro cell formed by altering the standard expanded macro cell of FIG. 11.
Figure 16A:
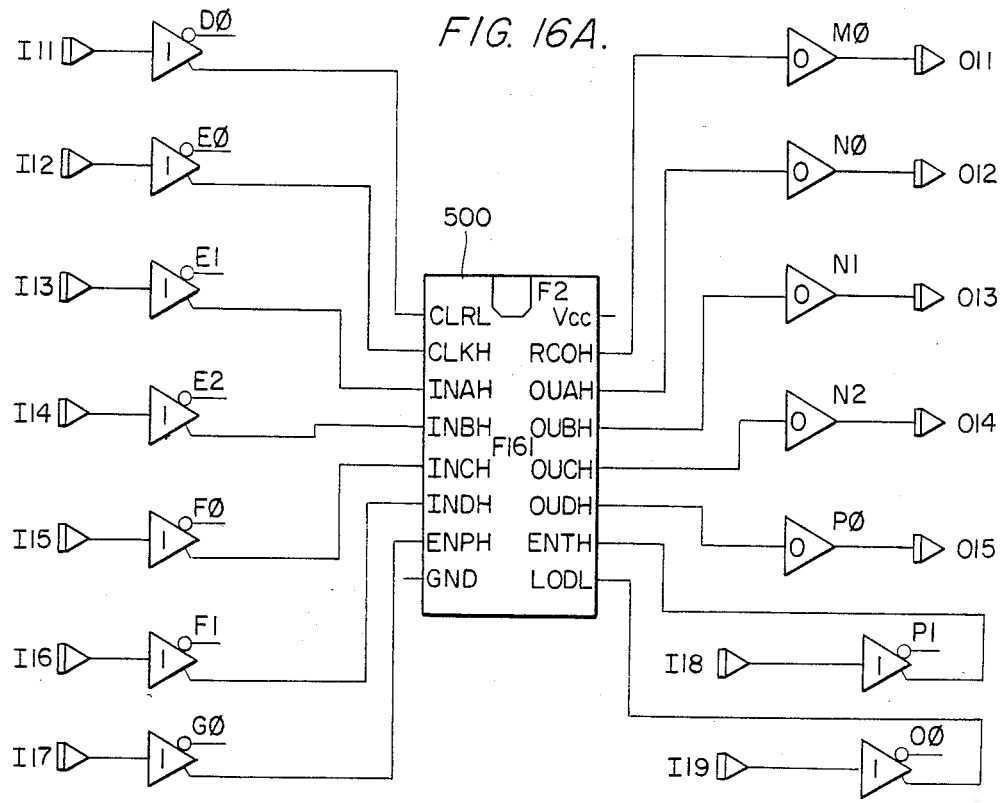
FIGS. 16A, 16B, 16C and 16D form a logic diagram for an example of a logic system as designed by a customer.
Figure 16B:
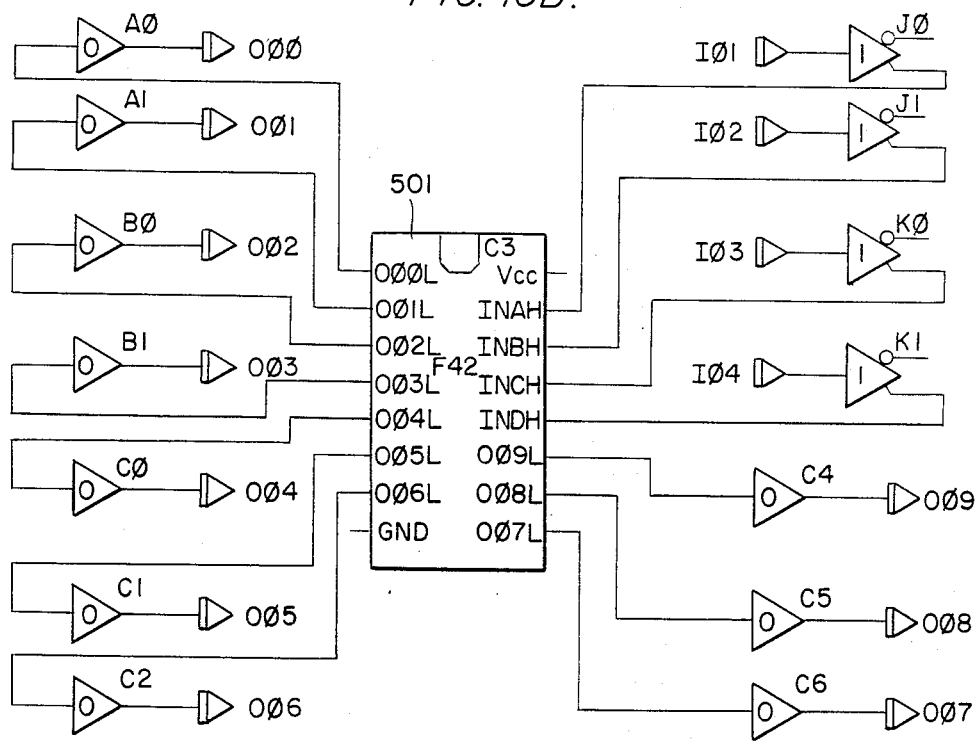
Figure 16C:
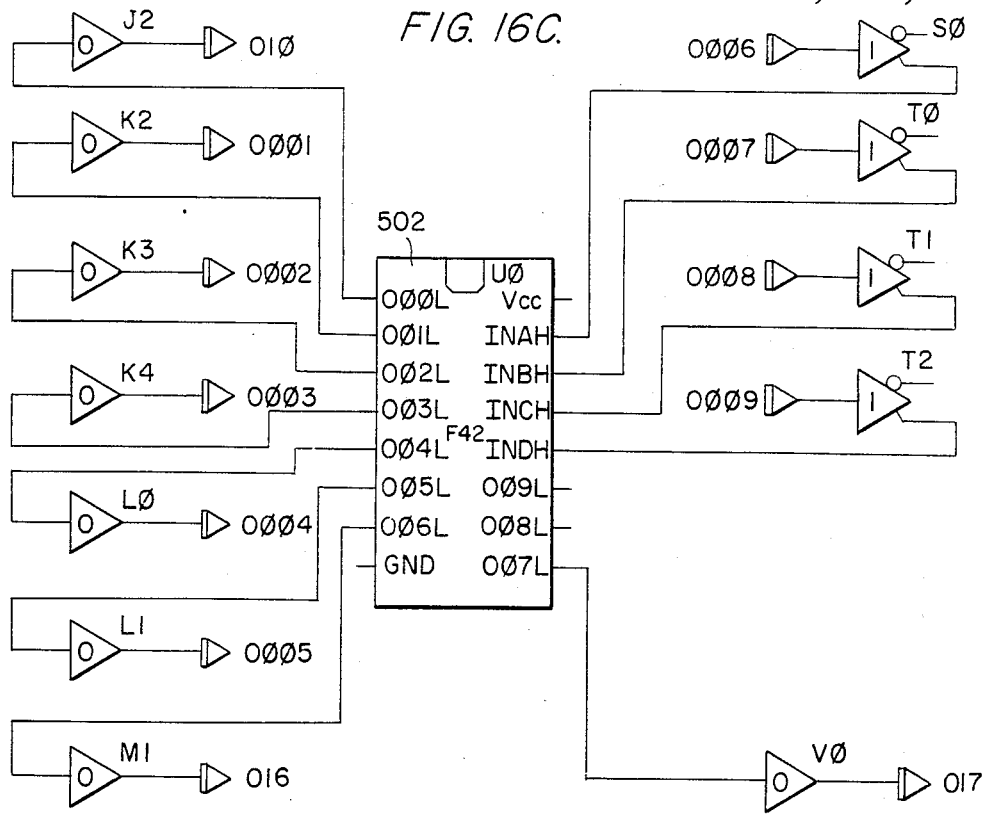
Figure 16D:
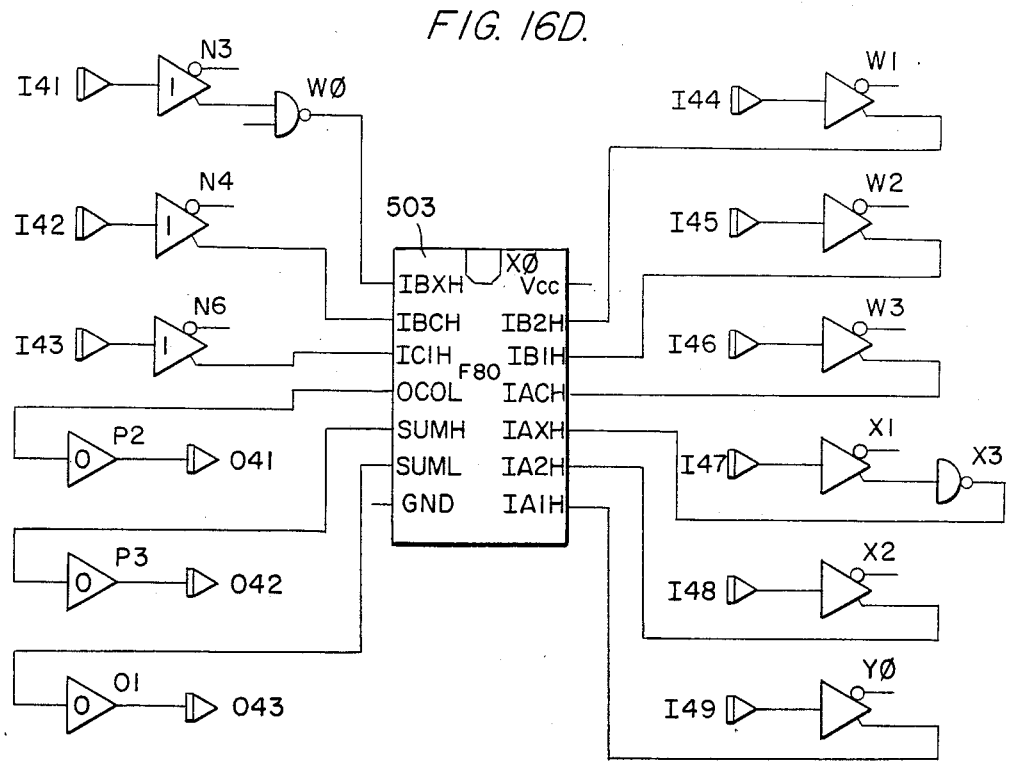

FIG. 15 is a logic diagram of a custom expanded macro cell corresponding to an altered version of the standard expanded macro cell of FIGS. 11, 12. As shown in FIG. 15, two output terminals "O$\phi$8L," "O$\phi$9L," three macro cells "X1," "X$\phi$," "P2" (which are equivalent to a total of 6 basic cells), and related wiring are eliminated from the expanded macro cell "F42" of FIGS. 11, 12. In FIG. 16C, a symbol for identifying the custom expanded macro cell in FIG. 15 is used in the logic diagram of the logic system. This symbol is almost the same as the corresponding symbol for the standard expanded macro cell of FIG. 12. However, when designers put this symbol in the logic diagram of the logic system, they do not use the accessible terminals "O$\phi$8L," "O$\phi$9L," i.e., these terminals are not connected to other expanded macro cells or terminals. Therefore, it can be determined whether the expanded macro cell is a standard expanded macro cell or a custom expanded macro cell depending upon whether unused terminals exist. The detailed data of the expanded macro cell is constructed in such a way that unused terminals, macro cells and wiring can be easily eliminated without altering the significant portion of the logic function, in order to make the detailed data for a custom expanded macro cell. This elimination procedure can be fully automated with CAD support or can be modified manually.

Figure 23:
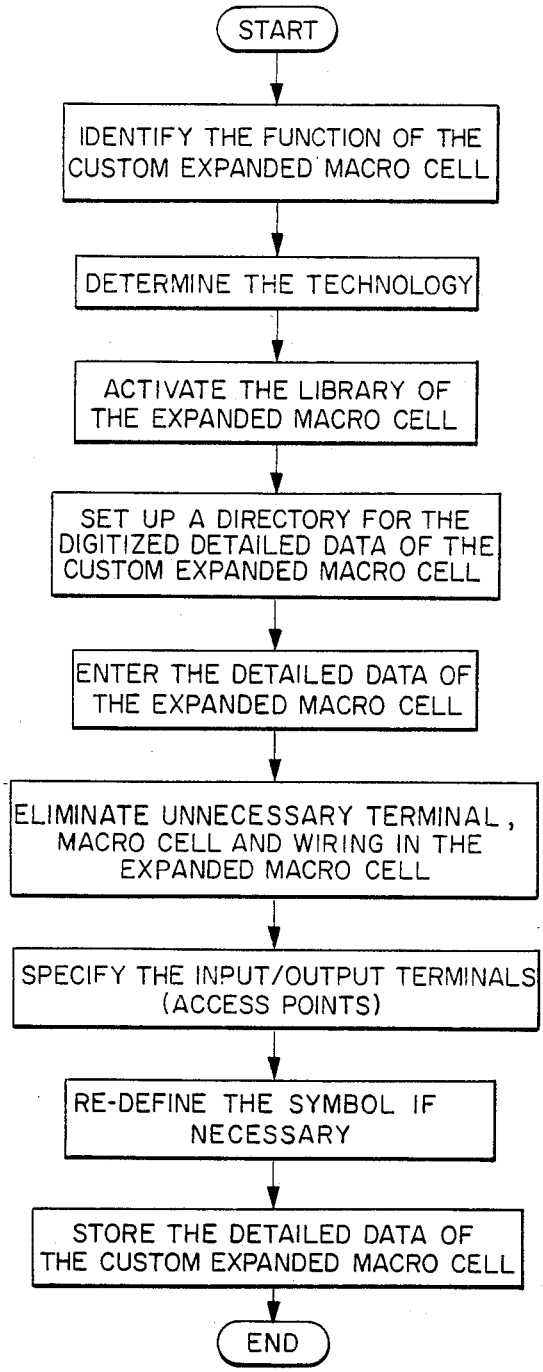

FIG. 23 is the flow chart for the program steps for storing data for the custom expanded macro cell. In the same way as with the standard expanded macro cell detailed data, the logic function of the custom expanded macro cell is identified; the appropriate technology is determined; the library of the expanded macro cells is activated; and the directory for the detailed data is set up. After that, the detailed data of the standard expanded macro cell, corresponding to the custom expanded macro cell which will be created, is entered. Based on this corresponding standard expanded macro cell detailed data, the custom expanded macro cell is created by eliminating the data for the unused terminals, macro cells and wiring, from the detailed data of the standard expanded macro cell. The structure of the detailed data is, for example, the binary tree-structure in which it is easy to eliminate this data without whole modification. In addition, the input/output terminals are specified. If necessary, the symbol is redefined and the detailed data is stored in the memory system 806.

The many features and advantages of the invention are apparent from the detailed specification and thus it is intended by the appended claims to cover all such features and advantages of the system which fall within the true spirit and scope of the invention. Further, since numerous modifications and changes will readily occur to those skilled in the art, it is not desirable to limit the invention to the exact construction and operation shown and described and, accordingly, all suitable modifications and equivalents may be resorted to, falling within the scope of the invention.

What is claimed is:

1. A method for manufacturing a gate array integrated circuit device which comprises a logic system formed on a semiconductor substrate, comprising the steps of:
   (a) forming basic cells in an array on the semiconductor substrate, each basic cell comprising a bulk pattern for an active electric element;
   (b) storing, in a memory, first symbol data and first detailed data corresponding to macro cells, each of which comprises one or more basic cells and wiring connecting the active electric elements of the basic cell, and each of which has a standard first logic function, the first symbol data identifying each of the macro cells, the first detailed data identifying the connection of the active electric elements of the basic cell and the standard first logic function for each of the macro cells;
   (c) storing, in the memory, second symbol data and second detailed data corresponding to expanded macro cells, each of which is an MSI macro cell comprising a plurality of the macro cells and wiring connecting the macro cells, and each of which has a standard second logic function, the second symbol data identifying each of the expanded macro cells, the second detailed data identifying the connection of the macro cells and the standard second logic function for each of the expanded macro cells;
   (d) storing, in the memory, logic system data corresponding to the logic system, the logic system data identifying the macro cells and the expanded macro cells forming the logic system and the wiring connecting the macro cells and the expanded macro cells, the logic system data comprising the first and second symbol data and the data identifying the connection of the macro cells and the expanded macro cells; and
   (e) forming a conductive wiring pattern for the semiconductor substrate by synthesizing the logic system data and the first and second detailed data.

2. A method for manufacturing a gate array integrated circuit device as set forth in claim 1, wherein step (e) comprises generating a layout map by synthesizing the logic system data and the first and second detailed data.

3. A method for manufacturing a gate array integrated circuit device as set forth in claim 1, further comprising the steps of:
   (f) simulating a logic function of the logic system data after step (d); and
   (g) checking for a logic violation of the logic system data after step (d).

4. A method for manufacturing a gate array integrated circuit device as set forth in claim 1, wherein said storing step (c) comprises identifying each of the expanded macro cells so that the number of the basic cells in each expanded macro cell is more than 12, and the number of the electric elements in each expanded macro cell is more than 100.

5. A method for manufacturing a gate array integrated circuit device as set forth in claim 1, wherein said storing step (b) comprises identifying each of the macro cells so that the number of the basic cells in each of the macro cells is no more than 12, and the number of the electric elements in each macro cell is no more than 100.

6. A method for manufacturing a gate array integrated circuit device as set forth in claim 1, wherein said storing step (c) comprises providing, as the second symbol data, a rectangle having a top, an expanded macro cell name provided inside the rectangle, an index mark provided at the top of the rectangle, and labelled terminals provided at the peripheral area of the rectangle.

7. A method for manufacturing a gate array integrated circuit device as set forth in claim 6, wherein the distance between adjacent ones of the labelled terminals is identical for all the labelled terminals.

8. A method for manufacturing a gate array integrated circuit device as set forth in claim 1, wherein said storing step (c) comprises providing, as the second symbol data, a rectangle having a top, a peripheral area, an expanded macro cell name provided at the top of the rectangle, and labelled terminals provided at the peripheral area of the rectangle.

9. A method for manufacturing a gate array integrated circuit device as set forth in claim 8, wherein the distance between adjacent ones of the labelled terminals is identical for all the labelled terminals.

10. A method for manufacturing a gate array integrated circuit device as set forth in claim 1, wherein said storing step (c) comprises providing as the second detailed data, macro cell data identifying the macro cells in the expanded macro cell, the terminals for each of the macro cells, and the connections of the terminals of the macro cells.

11. A method for manufacturing a gate array integrated circuit device as set forth in claim 1, wherein:
   said storing step (b) comprises storing the first symbol data and the first detailed data in a semi-permanent memory apparatus;
   said storing step (c) comprises storing the second symbol data and the second detailed data in the semi-permanent memory apparatus; and
   said storing step (d) comprises storing the logic system data in a memory system.

12. A method for manufacturing a gate array integrated circuit device as set forth in claim 1, wherein said forming step (a) comprises forming the basic cells so that each basic cell comprises a bulk pattern for an input transistor, an output transistor, a diode, and resistors.

13. A method for manufacturing a gate array integrated circuit device as set forth in claim 1, wherein said storing step (b) comprises storing the first symbol data and the first detailed data for a macro cell comprising one basic cell and having, as the first logic function, a NAND function.

14. A method for manufacturing a gate array integrated circuit device which comprises a logic system formed on a semiconductor substrate, comprising the steps of:
   (a) manufacturing basic cells in an array on the semiconductor substrate, each basic cell comprising a bulk pattern for an active electric element;
   (b) storing, in a memory, first symbol data and first detailed data corresponding to macro cells, each of which comprises one or more basic cells and wiring connecting the active electric elements of the basic cell, and each of which has a standard first logic function, the first symbol data identifying each of the macro cells, the first detailed data identifying the connection of the active electric elements of each basic cell and the standard first logic function for each or the macro cells;

(c) storing, in the memory, second symbol data and second detailed data corresponding to expanded macro cells, each of which is an MSI macro cell comprising a plurality of the macro cells, a plurality of terminals for connection outside the expanded macro cell, and wiring connecting the macro cells and the terminals, and each of which has a standard second logic function, the second symbol data including second symbols for identifying the expanded macro cells, the second detailed data identifying the macro cells, the terminals, the connections of the macro cells and the terminals, and the standard second logic function for each of the expanded macro cells;

(d) storing, in the memory, third symbol data and third detailed data corresponding to custom expanded macro cells, each custom expanded macro cell corresponding to a modification of one of the expanded macro cells, and comprising a plurality of the macro cells, a plurality of terminals for connection outside the custom expanded macro cell, and wiring connecting the macro cells and the terminals, the third symbol data including third symbols for identifying the custom expanded macro cells, the third symbols being modifications of the respective corresponding second symbols, the third detailed data identifying the macro cells included in the custom expanded macro cells, the terminals, and the connections of the macro cells and the terminals, the number of at least one of the macro cells, terminals or wiring for each custom expanded macro cell, being less than that for the corresponding expanded macro cell;

(e) storing, in the memory, logic system data corresponding to the logic system, the logic system data identifying the macro cells, the expanded macro cells and the custom expanded macro cells, and the wiring connecting the macro cells, the expanded macro cells, and the custom expanded macro cells, the logic system data comprising the first, second and third symbol data corresponding to the identified macro cells, expanded macro cells, and custom expanded macro cells, and the connections of the identified macro cells, expanded macro cells, and custom expanded macro cells; and (f) forming a conductive wiring pattern for the semiconductor substrate by synthesizing the logic system data and the first, second and third detailed data.

15. A method for manufacturing a gate array integrated circuit device as set forth in claim 14, wherein said step (f) comprises generating a layout map by synthesizing the logic system data and the first, second and third detailed data.

16. A method for manufacturing a gate array integrated circuit device as set forth in claim 14, further comprising the steps of:
(g) simulating a logic function of the logic system data; and
(h) checking a logic violation of the logic system data after step (e).

17. A method for manufacturing a gate array integrated circuit device as set forth in claim 14, wherein said storing step (c) comprises identifying each of the expanded macro cells so that the number of the basic cells in each expanded macro cell is more than 12, and the number of the electric elements in each expanded macro cell is more than 100.

18. A method for manufacturing a gate array integrated circuit device as set forth in claim 14, wherein said storing step (b) comprises identifying each of the macro cells so that the number of the basic cells in each of the macro cells is lower than 12, and the number of the electric elements in each macro cell is less than 100.

19. A method for manufacturing a gate array integrated circuit device as set forth in claim 14, wherein said storing step (c) comprises providing, as the second symbol data, a rectangle having a top, a peripheral area, a name provided inside the rectangle, an index mark provided at the top of the rectangle, and labelled terminals provided at the peripheral area of the rectangle shape.

20. A method for manufacturing a gate array integrated circuit device as set forth in claim 19, wherein the distance between adjacent ones of the labelled terminals is identical for all the labelled terminals.

21. A method for manufacturing a gate array integrated device as set forth in claim 14, wherein said storing step (c) comprises providing, as the second symbol data, a rectangle having a top, a peripheral area, a name provided at the top of the rectangle, and labelled terminals provided at the peripheral area of the rectangle.

22. A method for manufacturing a gate array integrated circuit device as set forth in claim 21, wherein the distance between adjacent ones of the labelled terminals is identical for all the labelled terminals.

23. A method for manufacturing a gate array integrated circuit device as set forth in claim 14, wherein said storing step (c) comprises providing, as the second detailed data, macro cell data identifying the macro cells therein, the terminals for each of the macro cells and the connections of the terminals of the macro cells.

24. A method for manufacturing a gate array integrated circuit device as set forth in claim 14, wherein:
said storing step (b) comprises storing the first symbol data and the first detailed data in a semi-permanent memory;
said storing step (c) comprises storing the second symbol data and the second detailed data in the semi-permanent memory apparatus; and
said storing step (d) comprises storing the third symbol data, the third detailed data, and the logic system data in a memory system.

25. A method for manufacturing a gate array integrated circuit device as set forth in claim 14, wherein said forming step (a) comprises forming the basic cells so that each basic cell comprises a bulk pattern for an input transistor, an output transistor, a diode, and resistors.

26. A method for manufacturing a gate array integrated circuit device as set forth in claim 14, wherein said storing step (b) comprises storing first symbol data and first detailed data for a macro cell comprising one basic cell having, as the first logic function, a NAND function.

27. A method for generating a wiring pattern for a gate array integrated circuit device with the aid of a computer, the gate array integrated circuit device comprising a logic system formed on a semiconductor substrate, the logic system including macro cells formed by basic cells and having standard logic functions, and expanded macro cells which are MSI macro cells formed by combinations of the macro cells and which have standard logic functions, the method comprising the steps of:

(a) providing the computer with a data base, including first symbol data and first detailed data corresponding to the macro cells, and second symbol data and second detailed data corresponding to the expanded macro cells, the first symbol data identifying each of the macro cells, the second symbol data identifying each of the expanded macro cells, the first detailed data identifying the connection of the active electric elements of the basic cell and the standard logic function for each of the macro cells, the second detailed data identifying the connection of the macro cells and the standard logic function for each of the expanded macro cells;

(b) inputting logic system data comprising symbol data selected from the first and second symbol data representing the macro cells and the expanded macro cells, respectively, the logic system data further comprising data defining the interconnection of the expanded macro cells and the macro cells; and (c) generating, with the aid of the computer, the wiring pattern for the gate array integrated circuit device corresponding to the logic system data in accordance with the data base.

28. A method as set forth in claim 27, further comprising the steps of:

(d) simulating the logic function of the logic system corresponding to the logic system data; and (e) checking for a logic violation of the logic system data.

29. A method as set forth in claim 27, wherein said inputting step (b) includes inputting custom data including custom symbol data and custom detailed data corresponding to a custom expanded macro cell, each custom expanded macro cell corresponding to a modification of one of the expanded macro cells and comprising a plurality of the macro cells, a plurality of terminals for connection outside the custom expanded macro cell, and wiring connecting macro cells and the terminals, the number of at least one of the macro cells, terminals or wiring being less than that of the corresponding expanded macro cell.

* * * * *